US008175859B1

(12) United States Patent
Wu et al.

(10) Patent No.: US 8,175,859 B1
(45) Date of Patent: May 8, 2012

(54) EFFICIENT METHOD FOR PRESSURE DEPENDENT WATER DISTRIBUTION ANALYSIS

(75) Inventors: Zheng Yi Wu, Watertown, CT (US); Thomas M. Walski, Nanticoke, PA (US); Rong He Wang, Oakville, CT (US); Daniel Bowdler, Waterville, CT (US)

(73) Assignee: Bentley Systems, Incorporated, Exton, PA (US)

( * ) Notice: Subject to any disclaimer, the term of this patent is extended or adjusted under 35 U.S.C. 154(b) by 629 days.

(21) Appl. No.: 11/777,491

(22) Filed: Jul. 13, 2007

Related U.S. Application Data

(63) Continuation-in-part of application No. 11/607,606, filed on Dec. 1, 2006.

(51) Int. Cl.
*G06G 7/50* (2006.01)
(52) U.S. Cl. .......................................................... 703/9
(58) Field of Classification Search .................. 703/2, 9
See application file for complete search history.

(56) References Cited

U.S. PATENT DOCUMENTS 7,013,248 B1* 3/2006 Todini et al. ...................... 703/2
2006/0060246 A1* 3/2006 Schuetze et al. ............... 137/488

OTHER PUBLICATIONS

Cheung et al, "Extension of Epanet for Pressure Driven Demand Modeling in Water Distribution System", http://artigocientifico.tebas.kinghost.net/uploads/artc_1147708476_40.pdf, Jun. 3, 2005.*
Cheung et al, "Extension of Epanet for Pressure Driven Demand Modeling in Water Distribution System", http://artigocientifico.tebas.kinghost.net/uploads/artc_1147708476_40.pdf, 2005 (Document Properties).*

Thomas M. Walski, Justin S. Weiler, Teresa Culver, "Using Criticality Analysis to Identify Impact of Valve Location", 8th Annual Water Distribution Systems Analysis Symposium, Cincinnati, Ohio, Aug. 27-30, 2006, 9 Pages.
Rob Casey, Paul F. Boulos, Chun Hou Orr, Christopher M. Bros, "Valve Criticality Modeling", 8th Annual Water Distribution Systems Analysis Symposium, Cincinnati, Ohio, Aug. 27-30, 2006, 8 Pages.
T.M. Baranowski, T.M. Walski, Z.Y. Wu, R. Mankowski, W. Hartell, "Trading Off Reliability and Cost in Optimal Water Distribution System Design", World Water and Environment Resource Congress 2003, Jun. 23-26, 2003, 10 Pages.
Thomas M. Walski, "Valves and Water Distribution System Reliability", American Water Works Association Annual Conference, New York, 1994, 14 Pages.
Thomas M. Walski, "Issues in Providing Reliability in Water Distribution Systems", ASCE EWRI Conference, Roanoke, VA, 2002, 10 Pages.
Thomas M. Walski, "Water Distribution Valve Topology for Reliability Analysis", Reliability Engineering and System Safety 42 (1993) Elsevier Science Publishers Ltd, England, 7 Pages (21-27).

(Continued)

*Primary Examiner* — David Silver
(74) *Attorney, Agent, or Firm* — Cesari and McKenna, LLP

(57) ABSTRACT

A computer software program provides an algorithm that solves for unknown demands (and junction pressures) within a modeling system that uses a generalized, unified loop-node formulation. The program can be used to calculate the available demand (i.e., the amount of water that is to be supplied) according to the nodal pressure. Both nodal heads and flows are simultaneously solved using a gradient algorithm, which allows, in accordance with the present invention, the model to simulate situations where a change in pressure affects the quantity of water used. Criticality analyses for segments of a system in such pressure dependent scenarios can also be performed using the software program of the present invention.

21 Claims, 26 Drawing Sheets

OTHER PUBLICATIONS

Ian Goulter, Thomas M. Walski, Larry W. Mays, Burca Sakarya, Francious Bouchart, Y. K. Tung, "Reliability Analysis for Design", Water Distribution Systems Handbook, Chapter 18, Department of Civil and Environmental Engineering, Arizona State University, Tempe, AZ, McGraw Hill, 2000.

"Criticality and Segmentation", Bentley WaterGEMS User's Guide, Jul. 4, 2006, pp. 2-271-2-287.

"Criticality Analysis", Bentley WaterCAD v8 xm Edition User's Guide, Released Jul. 4, 2006, pp. 10-458-10-468.

Lewis A. Rossman, "EPANET 2 Users Manual," United States Environmental Protection Agency, Water Supply and Water Resources Division, National Risk Mangement Laboratory, Cincinnati, OH 45268, Sep. 2000, pp. 1-200.

* cited by examiner

| SCENARIOS | J-1 | | J-2 | | J-3 | | J-4 | |
|---|---|---|---|---|---|---|---|---|
| | Q (m³/min) | P (m) | Q (m³/min) | P (m) | Q (m³/min) | P (m) | Q (m³/min) | P (m) |
| BASE | 2 | 17.13 | 2 | 16.1 | 3 | 11.08 | 1 | 15.83 |
| BASE AND FIRE FLOW | 2 | 14.97 | 2 | 10.55 | 3 | 0.02 | 4 | 1.98 |

FIG. 4

| TANK LEVEL (m) | J-1 | | J-2 | | J-3 | | J-4 | |
|---|---|---|---|---|---|---|---|---|
| | Q (m³/min) | P (m) | Q (m³/min) | P (m) | Q (m³/min) | P (m) | Q (m³/min) | P (m) |
| 109.86 | 1.95 | 16.29 | 1.86 | 13.93 | 2.32 | 6.57 | 3.13 | 9.64 |
| 100.00 | 1.37 | 8.03 | 1.37 | 7.58 | 1.45 | 2.59 | 2.53 | 6.28 |
| 98.78 | 1.28 | 7.01 | 1.30 | 6.80 | 1.31 | 2.11 | 2.44 | 5.89 |
| 96.82 | 1.12 | 5.38 | 1.18 | 5.57 | 1.06 | 1.37 | 2.31 | 5.26 |
| 91.97 | 0.58 | 1.42 | 0.81 | 2.66 | 0.00 | 0.00 | 2.01 | 3.97 |
| 91.03 | 0.38 | 0.60 | 0.70 | 1.97 | 0.00 | 0.00 | 1.88 | 3.47 |
| 89.08 | 0.00 | 0.00 | 0.36 | 0.51 | 0.00 | 0.00 | 1.57 | 2.43 |
| 85.00 | 0.00 | 0.00 | 0.00 | 0.00 | 0.00 | 0.00 | 0.00 | 0.00 |

FIG. 5

| SEGMENTS | SYSTEM FLOW (L/s) | CONVENTIONAL DEMAND-DRIVEN SIMULATION | | PDD SIMULATION WITH REFERENCE PRESSURE OF 14.1 m (20 psi) | | PDD SIMULATION WITH REFERENCE PRESSURE OF 70.3 m (100 psi) | |
|---|---|---|---|---|---|---|---|
| | | SYSTEM SUPPLIED FLOW (L/s) | SYSTEM DEMAND SHORTFALL (-) OR SURPLUS (+) % | SYSTEM SUPPLIED FLOW (L/s) | SYSTEM DEMAND SHORTFALL (-) OR SURPLUS (+) % | SYSTEM SUPPLIED FLOW (L/s) | SYSTEM DEMAND SHORTFALL (-) OR SURPLUS (+) % |
| S-1 | 42.8 | 42.8 | 0.0 | 42.8 | 0.0 | 42.8 | 0.0 |
| S-2 | 42.8 | 42.8 | 0.0 | 41.6 | -1.7 | 28.5 | -32.5 |
| S-3 | 42.8 | 30.1 | -28.8 | 30.1 | -28.8 | 29.3 | -30.6 |
| S-4 | 42.8 | 12.6 | -70.1 | 34.1 | -19.2 | 30.3 | -28.3 |
| S-5 | 42.8 | 7.2 | -83.0 | 30.3 | -28.3 | 23.1 | -45.3 |
| S-6 | 42.8 | 37.7 | -10.8 | 37.7 | -10.8 | 35.3 | -16.4 |
| S-7 | 42.8 | 33.9 | -19.8 | 33.9 | -19.8 | 29.0 | -31.3 |
| S-8 | 42.8 | 38.3 | -9.3 | 37.3 | -11.8 | 30.1 | -28.7 |
| S-9 | 42.8 | 42.1 | -0.3 | 42.1 | -0.3 | 42.1 | -0.3 |
| S-10 | 42.8 | 40.3 | -4.7 | 40.3 | -4.7 | 35.7 | -15.6 |
| S-11 | 42.8 | 39.8 | -5.8 | 39.8 | -5.8 | 35.4 | -16.3 |
| S-12 | 42.8 | 14.4 | -66.0 | 31.1 | -26.5 | 26.6 | -37.2 |
| S-13 | 42.8 | 36.8 | -13.0 | 36.8 | -13.0 | 31.5 | -25.5 |
| S-14 | 42.8 | 42.8 | 0.0 | 41.6 | -1.7 | 28.5 | -32.5 |

FIG. 11

| SEGMENTS | SYSTEM FLOW VOLUME (ML) | CONVENTIONAL DEMAND-DRIVEN SIMULATION | | PDD SIMULATION WITH REFERENCE PRESSURE OF 14.1 m (20 psi) | | PDD SIMULATION WITH REFERENCE PRESSURE OF 70.3 m (100 psi) | |
|---|---|---|---|---|---|---|---|
| | | SYSTEM SUPPLIED VOLUME (ML) | SYSTEM DEMAND SHORTFALL (-) OR SURPLUS (+) % | SYSTEM SUPPLIED VOLUME (ML) | SYSTEM DEMAND SHORTFALL (-) OR SURPLUS (+) % | SYSTEM SUPPLIED VOLUME (ML) | SYSTEM DEMAND SHORTFALL (-) OR SURPLUS (+) % |
| S-1 | 3.63 | 3.63 | 0.0 | 3.63 | 0.0 | 3.63 | 0.0 |
| S-2 | 3.63 | 0.34 | -90.9 | 0.34 | -90.4 | 0.34 | -90.9 |
| S-3 | 3.63 | 2.61 | -28.8 | 2.61 | -28.8 | 2.42 | -33.5 |
| S-4 | 3.63 | 1.10 | -70.5 | 2.88 | -21.6 | 2.61 | -28.3 |
| S-5 | 3.63 | 0.08 | -98.4 | 0.34 | -90.9 | 0.34 | -90.9 |
| S-6 | 3.63 | 3.26 | -10.8 | 3.26 | -10.9 | 2.95 | -19.2 |
| S-7 | 3.63 | 2.65 | -27.9 | 2.76 | -24.3 | 2.38 | -34.5 |
| S-8 | 3.63 | 3.03 | -17.6 | 3.03 | -17.5 | 2.50 | -31.2 |
| S-9 | 3.63 | 3.63 | -0.3 | 3.63 | -0.3 | 3.63 | -0.3 |
| S-10 | 3.63 | 3.37 | -8.3 | 3.41 | -7.1 | 2.99 | -18.6 |
| S-11 | 3.63 | 3.44 | -5.8 | 3.41 | -7.1 | 2.95 | -19.2 |
| S-12 | 3.63 | 1.06 | -70.6 | 2.50 | -31.6 | 2.20 | -40.3 |
| S-13 | 3.63 | 3.14 | -13.9 | 3.10 | -15.2 | 2.61 | -28.1 |
| S-14 | 3.63 | 0.34 | -90.9 | 0.34 | -90.9 | 0.34 | -90.9 |

FIG. 12

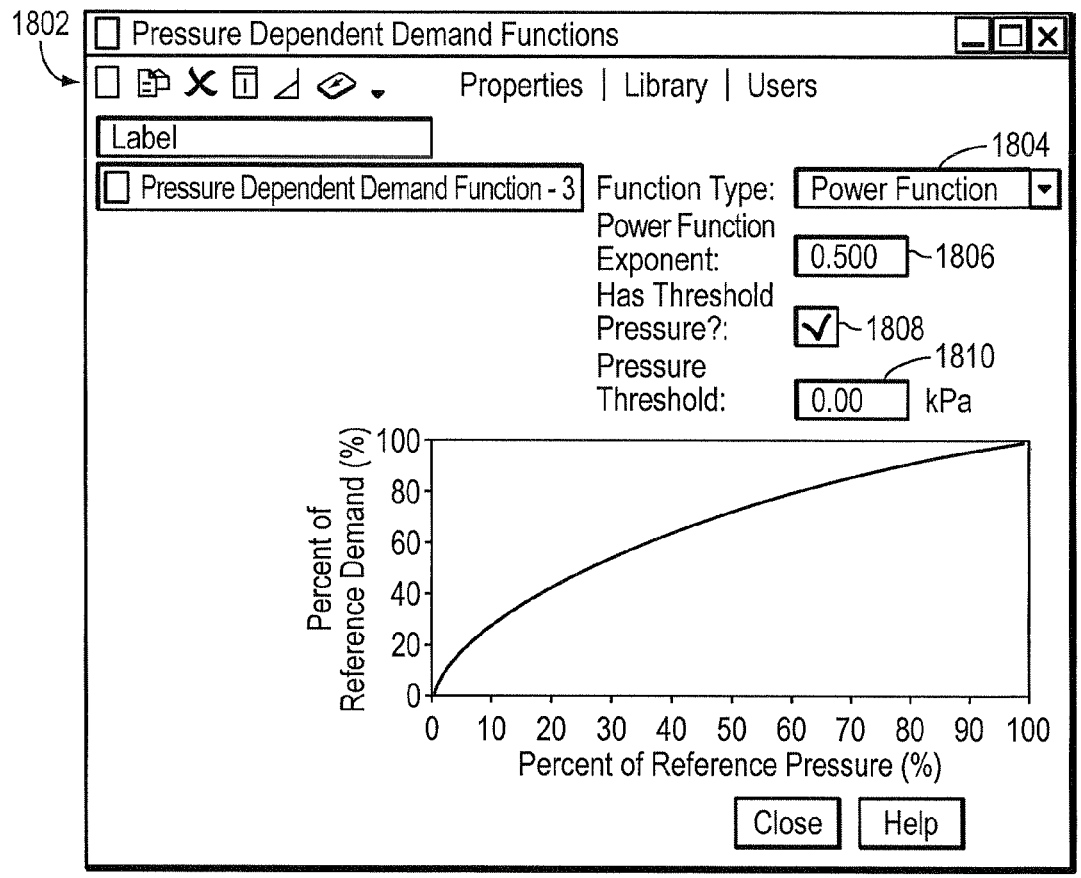

FIG. 18A

| New | Creates a new pressure dependent demand function. |
|---|---|
| Duplicate | Copies the currently selected demand. |
| Delete | Deletes an existing demand. |
| Rename | Renames an existing pressure dependent demand function. |
| Report | Generates a pressure dependent demand report based on the selected demand. |
| Synchronization Options | Browses the Engineering Library, synchronizes to or from the library, imports from the library or export to the library. |

FIG. 18B

| | Percent of Reference Pressure (%) | Percent of Reference Demand (%) |
|---|---|---|
| 1 | 10.0 | 20.0 |
| 2 | 20.0 | 30.0 |
| 3 | 45.0 | 45.0 |
| 4 | 60.0 | 55.0 |
| 5 | 80.0 | 90.0 |
| 6 | 100.0 | 100.0 |

Function Type: Piecewise Linear — 1860

EFFICIENT METHOD FOR PRESSURE DEPENDENT WATER DISTRIBUTION ANALYSIS

CROSS REFERENCE TO RELATED APPLICATION

This application is a continuation in part application based on U.S. patent application Ser. No. 11/607,606, of Walski et al. for a COMPUTER MODELING SOFTWARE FOR ANALYSIS OF THE CRITICALITY OF ELEMENTS IN A WATER DISTRIBUTION SYSTEM, which was filed on Dec. 1, 2006, the contents of which are presently incorporated by reference herein in entirety.

BACKGROUND OF THE INVENTION

1. Field of the Invention

This invention relates generally to computer software programs for modeling water distribution systems, and more particularly, to incorporating pressure dependencies in such models.

2. Background Information

A computer model of a water distribution system (also referred to herein as a hydraulic network) is a helpful tool to engineers involved in design, maintenance and day to day operation of the water distribution system. The model is created by representing the system as a network of links and nodes. The links are the pipes in the system. A node is a point in the network where water consumption is calculated and allocated as "demand." A node may be a household or a building in the network, or an arbitrary point of interest selected by the modeling engineer. Storage tanks, valves and pumps are also taken into account in the computer model of the network. The network behavior is emulated by the computer model using a link-node formulation that is governed by two conservation laws, namely mass balance at nodes, i.e., the mass of water coming into the node is equal to the mass of water exiting the node, and energy conservation around hydraulic loops, i.e., the total energy in the loop is constant. In conventional models, demand is treated as a known value. In other words, when initializing a hydraulic analysis model, typically, data is provided as to the customer's demand values. As long as the pressures are relatively constant in the system as they usually are in a normally running system in most developed nations, then that is adequate. However, the pressure may widely vary during the day as in a developing nation, or when there are special conditions in parts of the system such as pipe breaks, or power outages or fire fighting. In such cases, the assumption is that the demands are constant is not true. Instead, demand varies with pressure. Accounting for these conditions requires calculating pressure dependent demand.

Conventional water distribution models are formulated under the assumption that water consumptions (referred to as "demands") defined at nodes are known values so that nodal hydraulic heads and pipe flows can be determined by solving a set of quasi-linear equations. As noted, the network behavior is emulated by the computer model using a link-node formulation governed by the above mentioned conservation laws, namely mass balance at nodes, and energy conservation around hydraulic loops. More specifically, a traditional model is "solved" when a set of network hydraulics solutions are obtained by iteratively solving a set of linear and quasi-non-linear equations that are governed by mass conservation law to each node and energy conservation law to each loop. Thus, as there is an equation for each node and each loop, these equations are solved using matrix techniques. Using the known demand value, the nodal hydraulic head is determined. As is well known to those skilled in the art, hydraulic head is a measurement of total energy per unit weight at a particular height. The quantity of water flowing from one node to another node should be equal, but the rate of flow from the node of upper height to the node of lower height is defined by a hydraulic gradient. The hydraulic gradient also provides a measurement related to the demand. One problem being solved by the present invention relates to formulating the correct relationship (equation) for demands and pressure dependencies of such demands, and to solving such equations to efficiently calculate accurate pressure dependent demand values and flows at given nodes in the hydraulic network.

In one prior known approach, a unified formulation for solving network hydraulics was provided as a "global gradient algorithm" (GGA) (Todini & Pilati 1988 and Todini 1999) which is set forth in the following matrix equation:

$$\begin{bmatrix} A_{11} & \cdots & A_{12} \\ \cdots & \cdots & \cdots \\ A_{21} & \cdots & 0 \end{bmatrix} \begin{bmatrix} Q \\ \cdots \\ H \end{bmatrix} = \begin{bmatrix} -A_{10}H_0 \\ \cdots \\ -q \end{bmatrix} \quad (2)$$

Where Q is the $[n_p, 1]$ unknown pipe discharges in such units as feet per second; H represents the $[n_n, 1]$ unknown nodal heads measured in units of length such as feet, and q represents the $[n_n, 1]$ known nodal demands measured in units of volume such as cubic feet; $H_0$ is the $[n_t-n_n, 1]$ known nodal heads; $A_{11}$ is a $[n_p, n_p]$ diagonal matrix for pipes and pumps; $A_{12}$ and $A_{21}$ are the $[n_p, n_t]$ topological incidence matrix that defines the pipe and node connectivity; $A_{10}$ is a $[n_t-n_n, 1]$ topological incidences for known-head nodes; $n_t$ is the total number of nodes and $n_n$ is the number of unknown-head nodes and $n_p$ is the total number of links.

This formulation can be used to solve for the demand (q), but it is valid only if the hydraulic pressures at all nodes are adequate so that the demand is independent of pressure. It is also valid approach for analyzing volume-based demand such as filling bath tubs, flushing toilets etc. even under low pressure conditions. However, there are a number of scenarios where nodal pressure is not sufficient for supplying the required demand. As noted, these cases may include planned system maintenance, unplanned pipe outages, power failure at pump stations, fire fighting and insufficient water supply from water sources. In addition, some water consumptions like leakages are pressure dependent. In is such scenarios, where there is a pressure dependency, the conventional hydraulic modeling techniques are insufficient and possibly inaccurate for correctly modeling the behavior of the network under these pressure dependent circumstances.

Correctly measuring and predicting pressure dependent demand is an important requirement for companies providing water to communities because such companies must constantly evaluate the level of water supply service while coping with emergency events. In the United Kingdom (UK), for example, a tentative guideline requirement (Ofwat 2004) is that a water system must meet a level of the original demand for the majority of customers such that the water companies are required by law to provide water at a pressure that will, under normal circumstances, enable it to reach the top floor of a house. In order to assess if this requirement is satisfied, the water companies are required to report against a service level corresponding to a pressure head of 10 meters (14.2 psi) at a flow of 9 liter per minute (2.4 gpm). In addition, the supply reference for unplanned and planned service interruptions is also to be evaluated and reported.

Thus, water asset management has become an ever-increasing task for water utilities. It requires a comprehensive evaluation of above and underground facilities including every pipeline segment in a water system. Thus, impact and criticality analyses are carefully performed for each pipe segment in a system in order to form a rational basis for asset management plan. The impact evaluation is usually undertaken by performing the hydraulic analysis under the assumption that a pipe or a number of pipes is out of service, namely disconnected from a system, which is likely to cause pressure deficient conditions. The accurate analysis cannot be achieved without considering the impact of the pressure change on the flow supplied. is There remains a need, therefore, for a water distribution modeling system that can be used to efficiently calculate pressure dependent demand and to thus accurately predict network behavior under various scenarios.

SUMMARY OF THE INVENTION

The disadvantages of prior techniques are overcome by the present invention which is a robust and efficient method and system for modeling a water distribution system that includes a technique for the analysis of pressure-dependent demand. Instead of treating the demand as a known value as in prior techniques, the computer software program of the present invention provides an algorithm that solves for unknown demands (and junction pressures) within a modeling system that uses a generalized, unified loop-node formulation. Thus, the program of the present invention can be used to calculate the available demand (i.e., the amount of water that is to be supplied) according to the nodal pressure. Both nodal heads and flows are simultaneously solved using a unique global gradient algorithm, which allows, in accordance with the present invention, the model to simulate situations where a change in pressure affects the quantity of water used. Criticality analyses for segments of a system in such pressure dependent scenarios can also be performed using the software program of the present invention.

BRIEF DESCRIPTION OF THE DRAWINGS

The invention description below refers to the accompanying drawings, of which:

FIG. 4 is a chart of convention hydraulic simulation results for the system of FIG. 3;

FIG. 5 is a chart of hydraulic simulation results for a model run using the techniques of the present invention for the system of FIG. 3;

FIG. 11 is a chart of a hydraulic simulation of the system of FIG. 9 illustrating criticality analysis results under a steady state simulation;

FIG. 12 is a chart of a hydraulic simulation of the system of FIG. 9 illustrating criticality analysis results under an extended period simulation;

DETAILED DESCRIPTION OF AN ILLUSTRATIVE EMBODIMENT

By way of further background, there are two types of demands. The first type is volume based demands which includes such events as toilet flushing, filling bath tubs, operating washing machines and dishwashers, township cooling waters and industry tanks and the like. The second type of demand is pressure based demands or pressure dependent demands (also referred to herein as "PDD"), which include flowing water such as from faucets, showers, sprinklers and leakages. Volume based demands are unlikely affected by the nodal pressure, because once the tub or tank is full, it is independent of pressures. Pressure based demands, on the other hand, are dependent on the available nodal pressure. When an emergency occurs, e.g. water main pipe breaks, fire fighting, or a facility such as a major pump goes out of service due to for example, a power failure, nodal pressures are thereby affected. Some locations or nodes may not have the sufficient pressure to provide water at all. These pressure dependent demands change as the nodal pressure changes.

When nodal pressure drops to and below zero, the demand is virtually zero depending on the elevation of the customer taps relative to the node elevation. Pressure dependent demand increases as nodal pressure increases. When nodal pressure rises to a certain level, so-called "reference pressure," 100% of the desired demand or the reference demand is supplied. Nodal demand may keep increasing as the pressure is above the reference pressure. However, it is believed that a junction demand that is not affected by pressure or water consumption will be kept constant if the pressure is above a threshold that is referred to as the "pressure threshold" above which demand is no longer sensitive to pressure. This pressure threshold must be greater than or equal to the reference pressure at which the target demand is met. Most demands follow this threshold rule except for leakages which continuously increase with pressure. In a pressure dependent envi ronment, the nodal head and flow relationship, namely the pressure dependent demand function, is defined as follows:

$$\frac{Q_i^s}{Q_{ri}} = \begin{cases} 0 & H_i \le 0 \\ \left(\frac{H_i}{H_{ri}}\right)^\alpha & H_i < H_t \\ \left(\frac{H_t}{H_{ri}}\right)^\alpha & H_i \ge H_t \end{cases} \qquad (1)$$

Where $H_i$ represents the calculated pressure at node i; $Q_{ri}$ denotes the requested demand or reference demand at node i; $Q_i^s$ is the calculated demand at node i; thus $Q_i^s/Q_{ri}$ is the ratio of calculated demand over the reference demand at a particular node i. $H_{ri}$ designates the reference pressure that is deemed to supply full requested/reference demand; $H_t$ is the pressure threshold above which the demand is independent of nodal pressure and $\alpha$ is an exponent of the pressure demand relationship.

Figure 1:
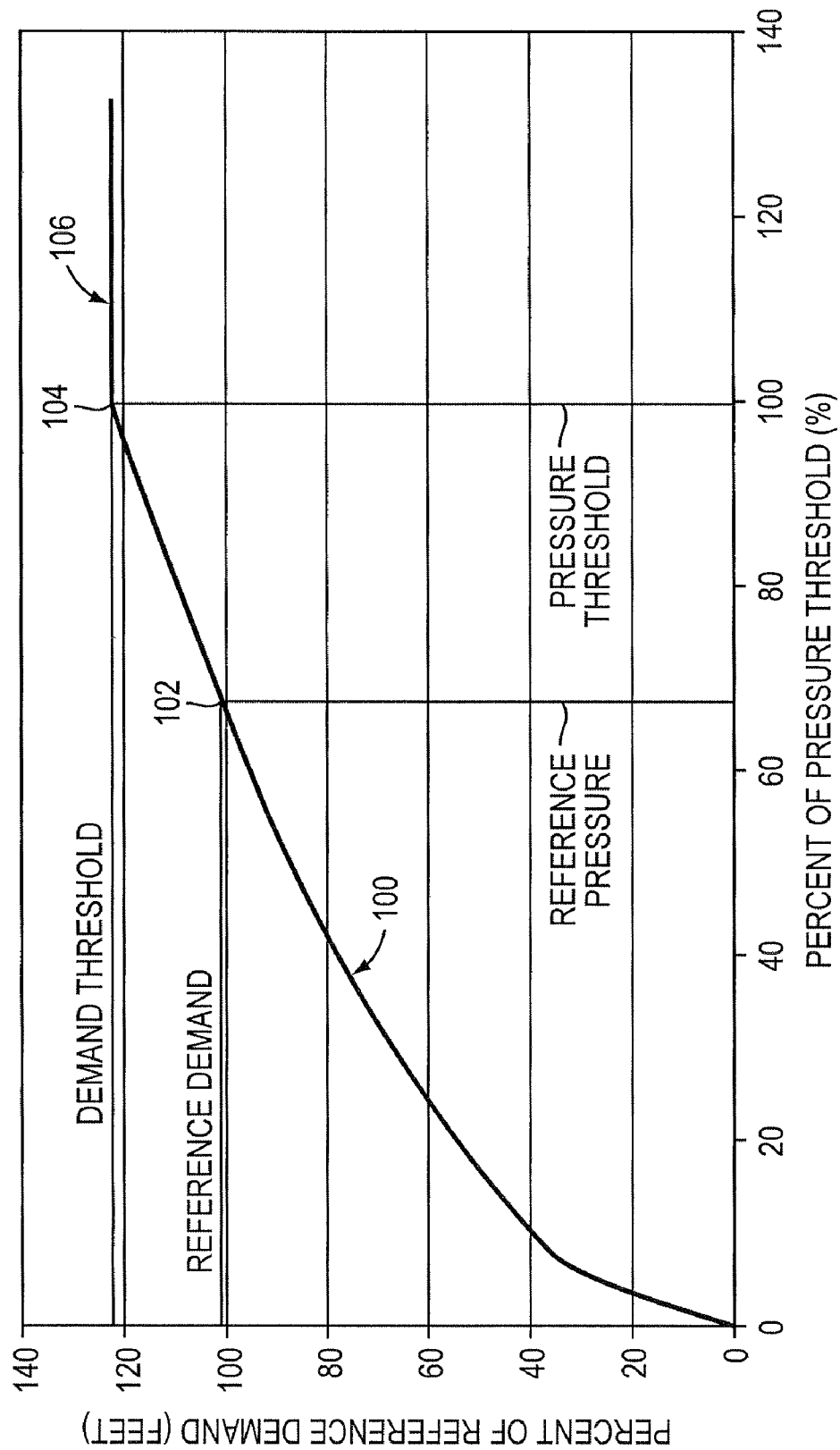
FIG. 1 is a graph of pressure measured as a percent of a pressure threshold versus demand as a measure of a percent of a reference demand, and illustrating a pressure dependent demand curve.

A typical PDD curve 100 is illustrated in FIG. 1, which is a plot of percent of pressure threshold, i.e., the ratio of actual pressure to a nodal threshold pressure along the x-axis versus percent of reference demand which is a measure of the calculated demand to a reference demand ($Q_i^s/Q_{ri}$) along the y-axis. The actual demand increases to the full requested demand (100%) at point 102, as pressure increases. The percent of reference demand increases until the pressure threshold is reached as shown at point 104. Then, demand remains constant after the pressure is greater than the pressure threshold, as shown in portion 106 of the curve 100. Thus, it should be understood from FIG. 1 that percent demand is related to percent pressure up to the pressure threshold. In some illustrative cases, this relationship may be exponential, but the nature of the relationship between demand and pressure may be defined differently in other applications of the software of the present invention.

Pressure dependent demand (PDD) is taken into account in a hydraulic network model under certain circumstances that will be described herein.

The PDD function can also be specified as a pressure-demand piecewise linear curve or a table of pressure percentage versus demand percentage. Pressure percentage is the ratio of actual pressure to a nodal threshold pressure while demand percentage is the ratio of the calculated demand to the reference demand. Unlike the conventional water is distribution model where the nodal demand is a known value, pressure dependent demand modeling approach stipulates that both the nodal demand and pressure are unknown. Solving for such a hydraulic model requires for reformulating the solution method, i.e., creating a new equation for the system.

As noted herein, a conventional network hydraulics solution is obtained by iteratively solving a set of linear and quasi-nonlinear equations that are governed by mass conservation law to each node and energy conservation law to each loop. A unified formulation for solving network hydraulics can be generalized the above noted global gradient algorithm (GGA) (Todini & Pilati 1988 and Todini 1999):

$$\begin{bmatrix} A_{11} & \cdots & A_{12} \\ \cdots & \cdots & \cdots \\ A_{21} & \cdots & 0 \end{bmatrix} \begin{bmatrix} Q \\ \cdots \\ H \end{bmatrix} = \begin{bmatrix} -A_{10}H_0 \\ \cdots \\ -q \end{bmatrix} \qquad (2)$$

Where Q is the $[n_p, 1]$ unknown pipe discharges; H and q are $[n_n, 1]$ the unknown nodal heads and known nodal demands respectively; $H_o$ is the $[n_t-n_n, 1]$ known nodal heads; $A_{11}$ is a $[n_p, n_p]$ diagonal matrix for pipes and pumps; $A_{12}$ and $A_{21}$ are the $[n_p, n_t]$ topological incidence matrix that defines the pipe and node connectivity; $A_{10}$ is a $[n_t-n_n, 1]$ topological incidences for known-head nodes; $n_t$ is the total number of nodes and $n_n$ is the number of unknown-head nodes and $n_p$ is the total number of links.

Pressure Dependent Demand Model Analysis

The computer software program of the present invention provides an algorithm that solves for unknown demands (and junction pressures) within a modeling system that uses a generalized, unified loop-node formulation. Thus the program of the present invention can be used to calculate the available demand (i.e., the amount of water that is to be supplied) according to the nodal pressure.

Figure 2:
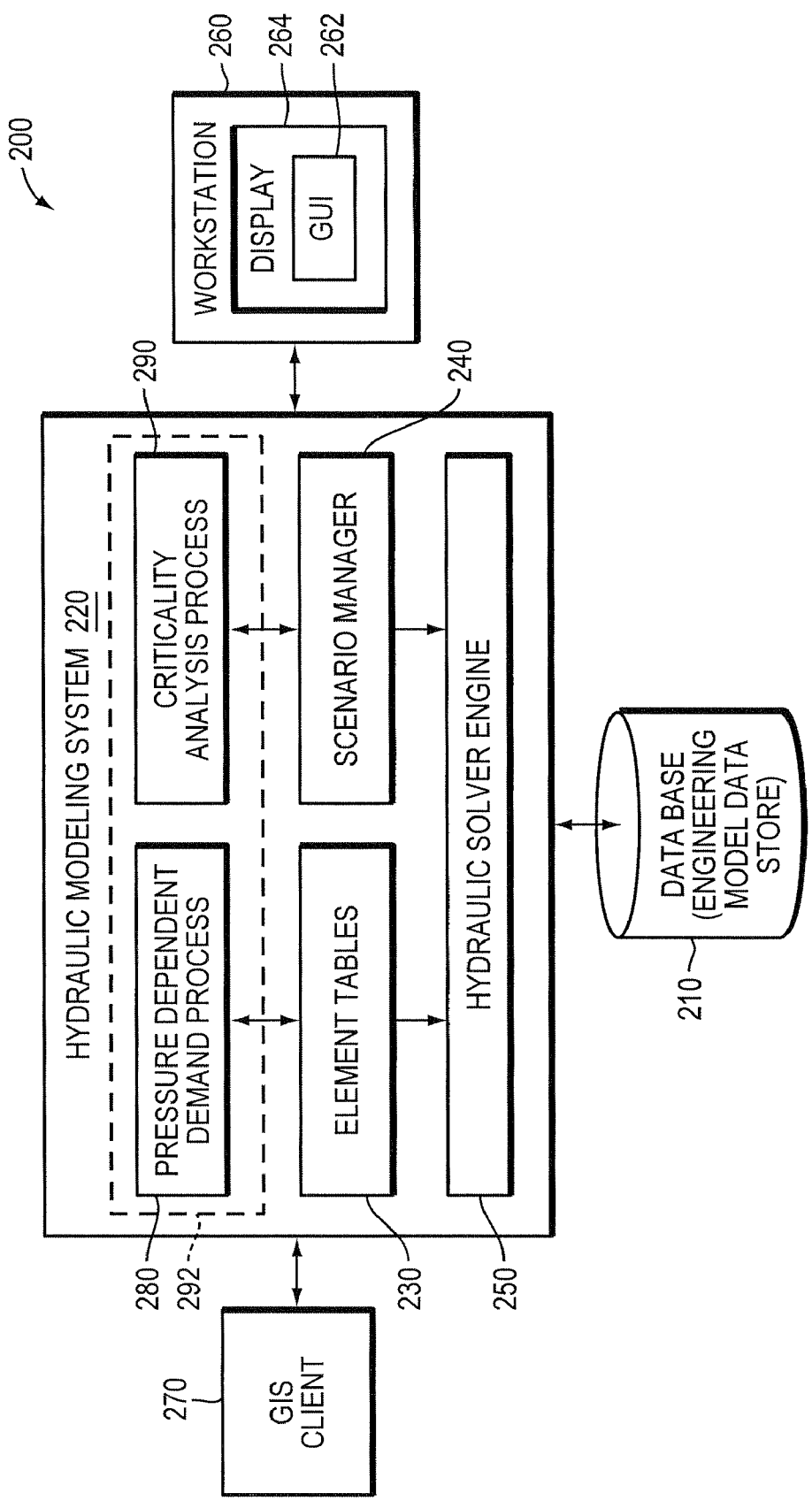
FIG. 2 is a schematic block diagram of the software program embodying the invention and related data structures and devices.

FIG. 2 illustrates one embodiment of the computer software program of the present invention though other implementations are within the scope of the invention. More specifically, the system 200 includes a database 210, which stores the data describing the elements of the engineering model, i.e., the water distribution network being represented. The database includes hierarchical records which identify these elements and their attributes. Further details about the storage and use of engineering modeling data with which the present invention can be used, are provided in commonly owned U.S. Pat. No. 7,107,280 for a METHOD AND SYSTEM FOR THE STORAGE AND USE OF ENGINEERING MODELING ALTERNATIVES WITH UNITIZED DATA, which issued on Sep. 12, 2006, which is presently incorporated by reference herein in its entirety.

A software interface (not shown) such as an object model is used for programmatic access to the data stored in the database 210 and this data is thus made available to a hydraulic modeling system 220. The hydraulic modeling system 220 may be any suitable modeling platform such as the platforms sold commercially under the trademarks WATER GEMS® and WATER CAD®, by Bentley Systems of Pennsylvania, which are illustrative only, and it should be understood that the invention is readily adaptable for use with other hydraulic modeling software platforms.

The hydraulic modeling system 220 includes element tables 230, or other suitable data structures, which are used to store information describing each particular element is (such as pipes, junctions, storage tanks, pumps, valves and the like) of the network that are being represented and analyzed by the user, such as a water engineer. These elements can be configured and analyzed in a model created under various scenarios, as selected by the user with scenario manager 240. The scenario manager 240 implements in software, certain "what if" scenarios, using the elements stored in the element table 230. A hydraulic solver engine 250 then runs a simulation of the water distribution system represented by the hydraulic model for that selected scenario using the information about the elements identified in the element tables 230. The water engineer can then evaluate the behavior of the water distribution network, as simulated, and can then make informed decisions about the design or rehabilitation of an actual water distribution network.

As discussed further herein, a modeling engineer programmer uses a work station 260 which may be a personal computer (PC) or other work station to enter data or make selections between options provided by the present invention. The entries made by the programmer at the work station 260 are used by the hydraulic network solver engine 250 to solve the matrix equations in order to produce a set of results for pressure and flow at each node in the network to thereby simulate the behavior of the network in accordance with the specification selected by the user. Various graphic interfaces (GUI's 262), which are described in further detail hereinafter, are displayed on a display 264 in the form of windows, maps, graphs, charts and tables at the programmers work station 260, or at an end user terminal via the Internet or other connection to the hydraulic modeling software system 220. The programmer's workstation 260 may also run various applications, such as a GIS (Geographic Information Systems) or CAD (Computer Aided Design) clients 270, which may be used to generate a topological representation of the hydraulic network, the model of which is generated by the hydraulic modeling software system 220.

In accordance with the invention, a user can determine the impact on overall system performance of a portion of the system that is subject to a pressure dependent demand using the pressure dependent demand process 280, which executes one or more program instructions to calculate the unknown demands in the system in the manner hereinafter described. In addition, information about the PDD aspects of the system can be passed to a criticality analysis routine 290. The hydraulic modeling software 220 can be programmed to execute one or more program instructions to take segments of the distribution system and simulates such segments as having failed or having been taken out of service for performance of maintenance or repairs. The impact of this segment outage is then calculated by the criticality analysis routine 290 and the results are presented on the display 264 for evaluation by the user. In accordance with the invention, pressure dependent demands are taken into account as described further herein.

For the pressure dependent demand function defined as Eq. (1), nodal demands are unknown. The present invention provides a technique for calculating these unknown nodal demands efficiently and accurately. More specifically, the software program of the present invention employs a novel gradient algorithm to simultaneously solve for nodal heads and demands using a PDD power function. To take into account unknown PDD at nodes, as the present invention provides the following matrix equation:

$$\begin{bmatrix} A_{11} & \ldots & A_{12} \\ \ldots & \ldots & \ldots \\ A_{21} & \ldots & A_{22} \end{bmatrix} \begin{bmatrix} Q \\ \ldots \\ H \end{bmatrix} = \begin{bmatrix} -A_{10}H_0 \\ \ldots \\ -q^* \end{bmatrix} \quad (3)$$

Where q* is a [1, $n_n$] vector of actual demands for pressure deficient nodes and $A_{22}$ is the [$n_n$, $n_n$] diagonal matrix for pressure deficient nodes with elements given as:

$$A_{22}(i, i) = \begin{cases} 0 & H_i \leq 0 \\ Q_{ri}\left(\frac{H_i}{H_{ri}}\right)^\alpha & H_i < H_t \\ Q_{ri}\left(\frac{H_t}{H_{ri}}\right)^\alpha & H_i \geq H_t \end{cases} \quad (4)$$

To solve the general formulation for the pressure dependent network analysis as Eq. (3), the derivation of the novel gradient algorithm of the present invention is given as:

$$\begin{bmatrix} D_{11} & \ldots & A_{12} \\ \ldots & \ldots & \ldots \\ A_{21} & \ldots & D_{22} \end{bmatrix} \begin{bmatrix} dQ \\ \ldots \\ dH \end{bmatrix} = \begin{bmatrix} dE \\ \ldots \\ dq \end{bmatrix} \quad (5)$$

The new diagonal matrix $D_{22}$, of the software program of the present invention, is the deviation of $A_{22}$ of pressure head H.

It is a power function which is used to define the exponential relationship between the nodal pressure and demand. The ratio of actual supplied demand is defined as a power function of the ratio of actual pressure ($H_i$) to the reference pressure ($H_t$). More specifically, for nodal head and flow function defined as Eq. (1), the corresponding power function expression in accordance with the invention is $$D_{22}(i, i) = \begin{cases} 0 & H_i^s \leq 0 \\ \alpha\left(\frac{H_i}{H_t}\right)^{\alpha-1} \times Q_i & H_i^s < H_t \\ 0 & H_i^s \geq H_t \end{cases} \quad (6)$$

Thus, the inventive technique adjusts for the pressure dependencies at the selected nodes by calculating $D_{22}$ for each pressure dependent demand node and adding the result to A(i, i) as follows.

$$A(i, i) = \sum_j p_{ij} - D_{22}(i, i) \quad \forall i \cap j \neq \emptyset, i \in 1, n_n, j \in 1, n_t \quad (7)$$

$$A(i,j) = -p_{ij} \forall i \cap j \neq \emptyset, i,j \in 1, n_n \quad (8)$$

Where j denotes the pipe j that is connected with node i, $p_{ij}$ is the inverse derivative of the headloss in the link between nodes i and j with respect to flow. This notation will be understood by those skilled in art. The inventive formulation for the diagonal matrix calculations may illustratively be implemented in a robust hydraulic network solver as sold commercially in various software programs of Bentley Systems mentioned herein, and thus allows the solver to allow for efficient and effective analysis of a variety of pressure is deficient scenarios.

Notably, the PDD function of the present invention provides a great deal of flexibility in specifying a function relationship between pressure and demand over a range of interest. A default setting for a suitable power function exponent as set forth above in equation (6) is a power function exponent ($\alpha$) of 0.5. The power function exponent is the coefficient that defines the power function relationship between the demand ratio and pressure ratio. The PDD function of the present invention can be readily applied in cases in which pressures exceed the reference pressure at which demands are fully met, thus enabling the PDD function to be applied to such conditions as analyzing leakage where the demand does not level off at high pressure.

Figure 3:
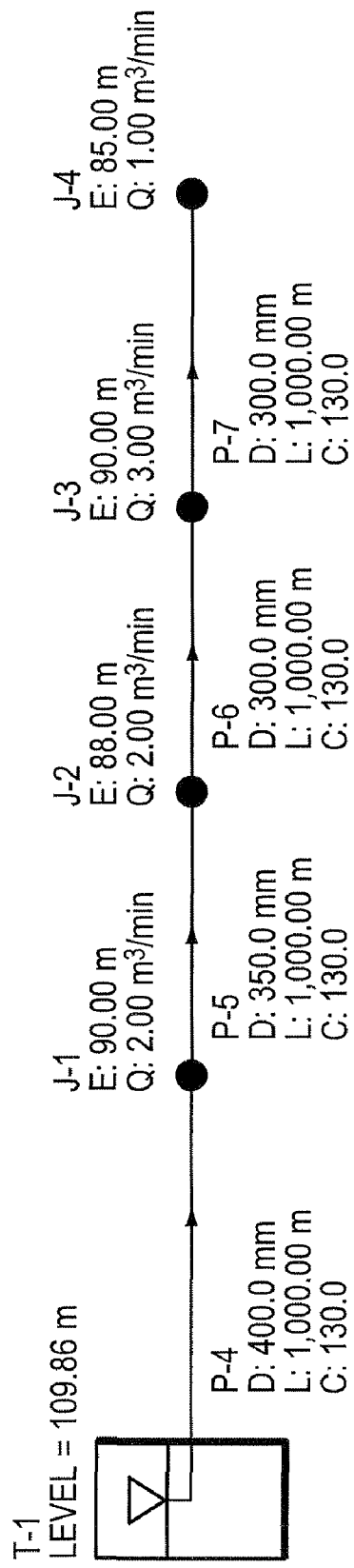
FIG. 3 is a schematic diagram of an illustrative water distribution system that can be advantageously modeled using the techniques of the present invention.

In order to better understand the use of the software embodying the invention, a simplified system is illustrated in FIG. 3, which is a schematic diagram of an illustrative water distribution system 300 that can be advantageously modeled using the techniques of the present invention. The example system consists of one source tank (T-1) which has an initial level of 109.86 meters (m). The system also includes four demand nodes: J1 having an head elevation of 90.00 m and a demand Q of 2.00 cubic meters per minute (m³/min); J-2 has and head elevation of 90.00 m, and a demand Q of 2.00 m³/min; J-3 has an head elevation of 90.00 m and a demand Q of 3.00 m³/min; and J-4 has an head elevation of 85.00 m and a demand Q of 1.00 m³/min. In addition, the system 300 includes four pipes in series, i.e, P-1 which has a diameter of 400.00 m, a length of 1,000.00 m and a circumference of 130.0 m; P-2 has a diameter of 350.00 m, a length of 1,000.00 m and a circumference of 130.0 m; P-3 has a diameter of 300.00 m, a length of 1,000.00 m and a circumference of 130.0 m; and P-4 has a diameter of 300.00 m, a length of 1,000.00 m and a circumference of 130.0 m.

Under the normal conditions, it is assumed that adequate nodal pressures are provided for meeting the desired demand. The pressure deficient condition is caused by supplying a fire flow of 3.00 m$^3$/min at node J-4 (notably the normal flow at node J-4 is 1.00 m$^3$/min). Demand-driven hydraulic simulation results are given as in Table 400 (FIG. 4) for both scenarios of the base demands with and without the fire flow. Conventional analysis shows that the pressure at J-3 significantly drops to almost zero (0.02) because of the fire flow demand at node J-4 for the Base and fire flow scenario. But, note that the demand of 3.0 m$^3$/min at J-3 (plus all the other municipal demands) are still met. This is a suspicious result that is highly unlikely to be valid. Thus, a pressure dependent demand approach can be applied in accordance with the invention, to analyze the system.

While applying the pressure dependent demand approach of the present invention to analyze the system, two scenarios are considered as follows.

Scenario I: all the nodal demands including fire flow at J-4 are considered as unknown pressure dependent demands, namely 100% PDD for all the nodes;

Scenario II: fire flow at J-4 is considered as volume-based demand while the other demands are treated as pressure dependent demands, that is, 25% PDD at node J-4 (because it is one of four nodes in the system) and 100% PDD at the other nodes.

Both scenarios are simulated for different available source heads or tank levels, which give different hydraulic grades and pressures at nodes. The pressure dependent demand analysis as undertaken by using the corresponding nodal pressures under normal conditions (base demand without fire flow) is provided in Table 400, as reference pressures for each node and a large value as pressure threshold. This means that the normal nodal demands (without fire flow at J-4) are met at the normal pressure conditions.

Under the fire flow conditions, the pressure dependent demand analysis results are given in Table 500 (FIG. 5) for 100% PDD, for all four nodes.

Figure 6:
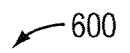
FIG. 6 is a chart of hydraulic simulation results for mixed volume based demand and pressure dependent demand for different source heads in the system of FIG. 3.

When all the nodal demands are treated as PDD, Table 500 shows that the demands (Q) including the fire flow (at J-4) decrease as the nodal pressures decrease. The predicted demand is zero when the pressure becomes zero or tank runs out of water. If the fire flow is treated as volume-based demand as shown in FIG. 6, and the other demands are modeled as PDD, Table 600 illustrates that the fire flow is always met when there is water available from the source (tank T-1), and that the pressure dependent demands change as pressure changes. The demands at the other nodes, however, have been reduced to almost zero at some low pressures.

Figure 7:
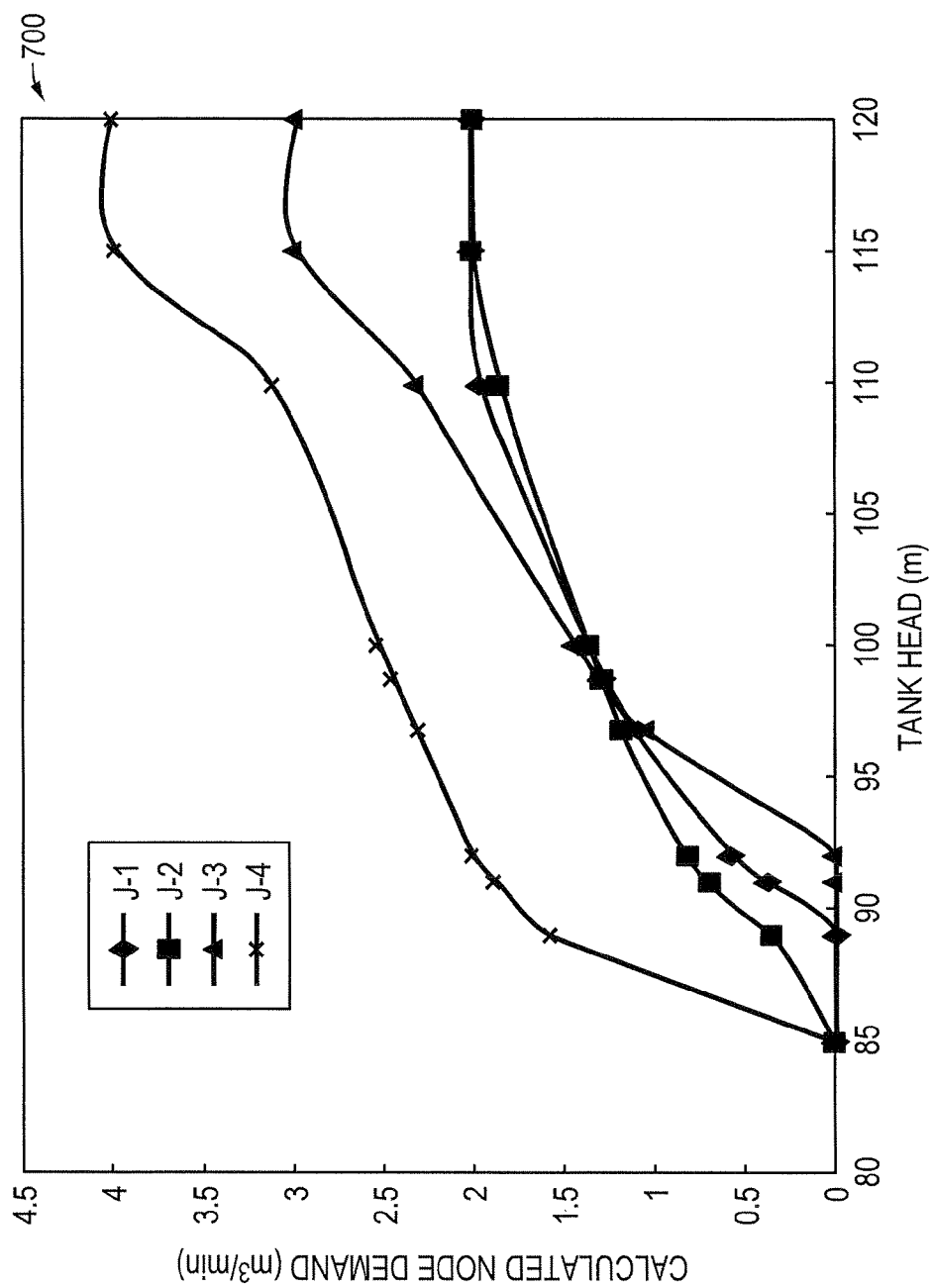
FIG. 7 is a graph of source tank in meters versus nodal demand in cubic meters per minute.

The results can also be understood with reference to the graph 700 of FIG. 7, which is a plot of source head in meters versus nodal demand in cubic meters per minute. The nodal demand at J-4 (the curve indicated by the x's) continues to be met and in fact increases as the tank head increases. The demand at the other nodes J-1 through J-3 more closely track one another and level off after a certain tank head value as is apparent from the FIG. 7.

This example shows that the method of the present invention can effectively simulate the scenario of pressure deficient conditions. The method is improved over previous methods in simulating the combination of pressure-dependent and volume-based demands at the same node and predicting the partial nodal demand, as illustrated in FIG. 7, when the nodal pressure is between zero and the reference pressure. This is illustrated in FIG. 7 as a particular tank head level (which is related to pressure, as will be understood by those skilled in the art).

Figure 8:
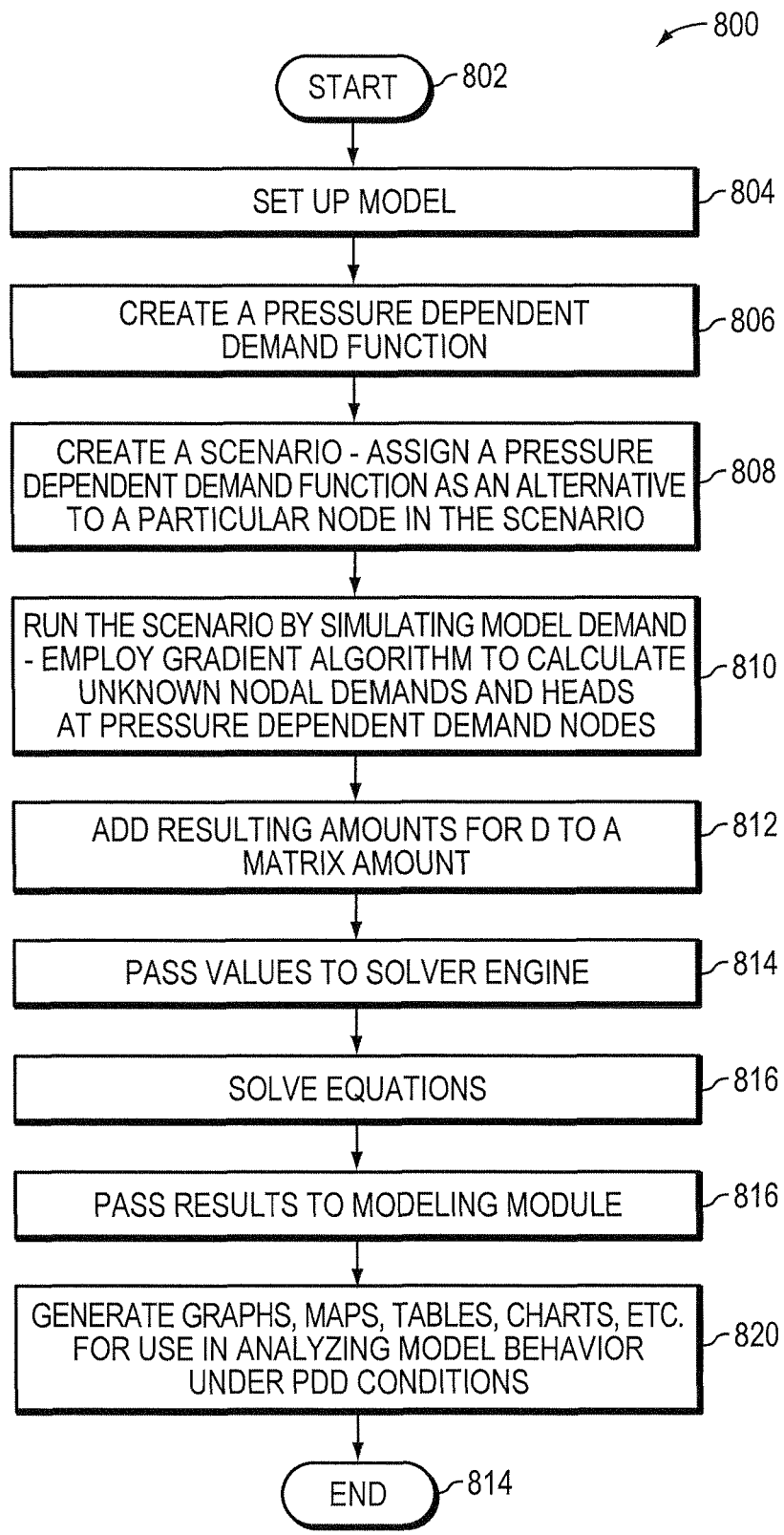
FIG. 8 is a flow chart of a procedure embodying the present invention for calculating pressure dependent demand.

The pressure dependent demand analysis process 280 of the present invention can be further understood with reference to the flow chart of FIG. 8. The procedure begins at step 802 and continues to step 804 in which a model is set up. The creation of a model involves selecting the elements, i.e., pipes, nodes, links, valves, tanks, pumps and any other physical devices and the layout of such elements (such as the elements T-1, J-1 through J-4 and P-1 through P-4 in the previous example). The physical attributes of each element such as pipe diameter, pipe roughness, pipe length and water tank level, and the like, are also specified as initial conditions. Once the model is created as in step 804, a pressure dependent demand function is created in step 806. This includes determining the pressure dependent demand nodes to be evaluated, such as the node J-4 in the previous example.

Then, in step 808 a scenario is created in which the pressure dependent demand is to assigned as an alternative feature in the scenario. Other aspects of the scenario can such as time of day, time of year, can be selected by the user for the run. A node to be evaluated in accordance with the invention is assigned as a pressure dependent demand node. In step 810, the scenario is run by performing a hydraulic simulation of the model under these conditions. In accordance with the invention, when the hydraulic solver engine 250 is computes the unknown nodal demands and heads for the PDD nodes, it uses the algorithm discussion above in which the diagonal matrix D is adjusted for the pressure dependency such that D is the deviation of $A_{22}$ of pressure head H. For nodal head and flow function defined as Eq. (1), the corresponding expression is $$D_{22}(i, i) = \begin{cases} 0 & H_i^s \leq 0 \\ \alpha\left(\frac{H_i}{H_t}\right)^{\alpha-1} \times Q_i & H_i^s < H_t \\ 0 & H_i^s \geq H_t \end{cases} \quad (6)$$

Thus, as shown in step 810, the procedure of the present invention employs the gradient algorithm of the present invention which includes calculating unknown nodal demand deviations using the diagonal matrix $D_{22}$ of pressure head for each pressure dependent demand node as selected by the user (such as J-1 through J-4 in the example above). Then, the procedure continues to step 812 in which the resulting amount is added to the A(i, i) matrix for the pressure dependent demand nodes to determine the calculated pressure $H_t$ from Equation (1) as follows:

$$A(i, i) = \sum_j p_{ij} - D_{22}(i, i) \quad \forall i \cap j \neq \emptyset, i \in 1, n_n, j \in 1, n_t \quad (7)$$

$$A(i,j) = -p_{ij} \forall i \cap j \neq \emptyset, i,j \in 1, n_n \quad (8)$$

Where j denotes the pipe j that is connected with node i, $p_{ij}$ is the inverse derivative of the headloss in the link between nodes i and j with respect to flow. Then, in step 814, is these amounts are passed to the hydraulic solver engine 250 for use in solving the matrix using appropriate matrix solution techniques known to those skilled in the art such as Newton-Raphson techniques, and the like, as in step 816. In step 818, the solver engine passes its results to the processes of the hydraulic modeling module of the system 220. The modeling module generates graphs, charts, maps and tables, as in step 820, such as those discussed herein, for use by a water engineer in analyzing the model behavior under the PDD conditions. The procedure ends at step 822.

Criticality Analysis

Figure 9:
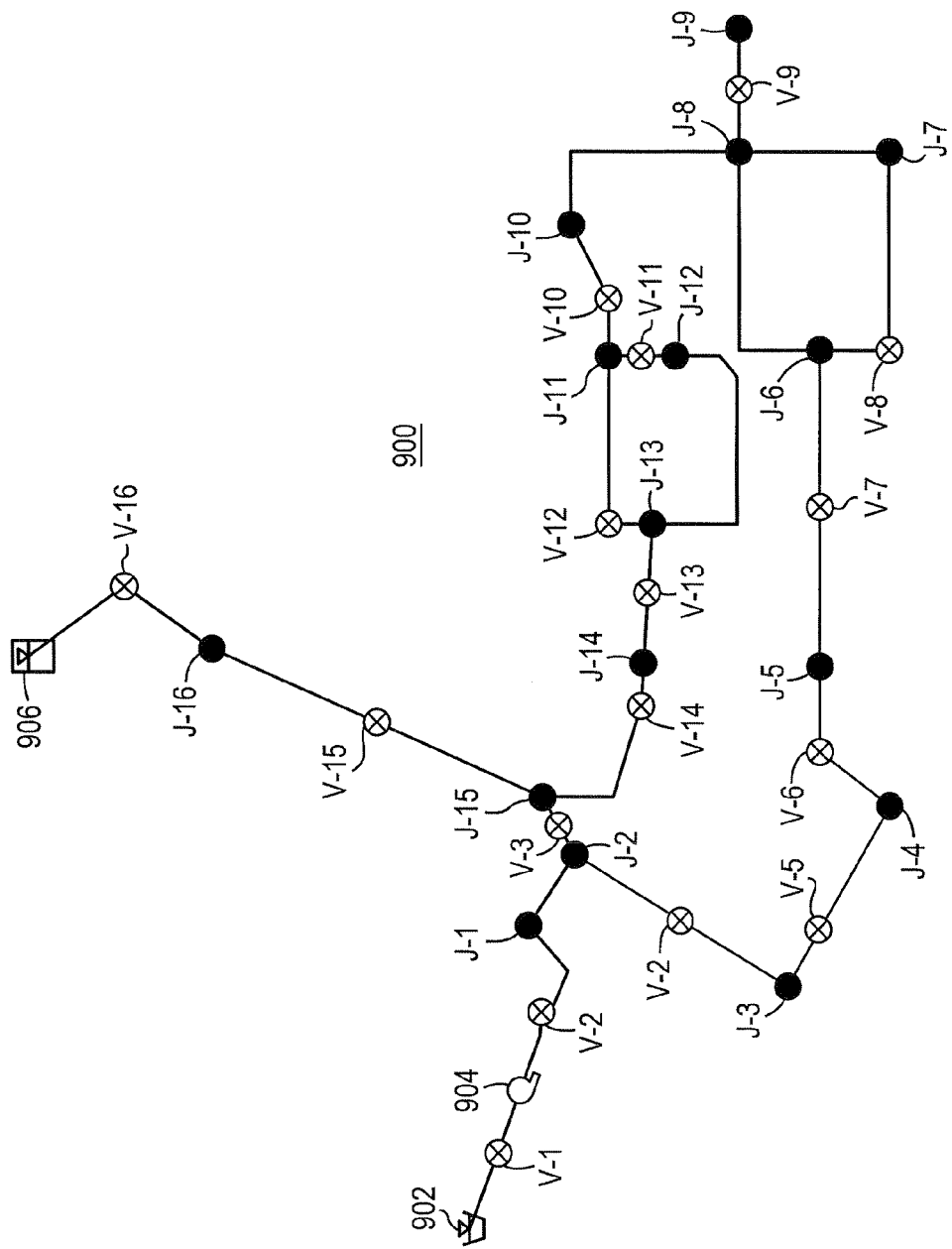
FIG. 9 is a schematic layout of a system with isolation valves used in a criticality analysis.

FIG. 9 illustrates a system 900 that includes a number of junction nodes J-1 through J-16. The system 900 is supplied by a reservoir 902 via a pump 904 and a storage tank 906 in a northern section of the system. This system is described herein in order to illustrate the techniques of the present invention as used in connection with a criticality analysis with and without pressure dependent demand.

Criticality analysis is used to evaluate the impact of element outages. Instead of considering each pipe outage as defined in a model, a practical approach is undertaken by dividing a system into a number of segments isolated by all the valves, each of which represents the smallest isolable portion of the system. The impact of the segment is evaluated by performing a hydraulic model simulation with the segment out of service. Further details of a technique for performing criticality analysis are provided in commonly owned U.S. patent application Ser. No. 11/607,606 of Walski et al., which was filed on Dec. 1, 2006, which is presently incorporated herein by reference in its entirety.

A number of indicators that can be used to assess the criticality of the segments are as follows:
1. System supply shortfall under steady state simulation;
2. System supply shortfall percentage;
3. Accumulated system supply shortfall over an extended period of time;
4. Percentage of accumulated system supply;
5. Node with maximum demand shortfall.

For a given outage, there are three cases for any node:
1. No effect on pressure (or demand);
2. Node is completely cut off from water source (demand supplied=0);
3. Demand is reduced because pressure drops (demand is unknown).

Figure 10:
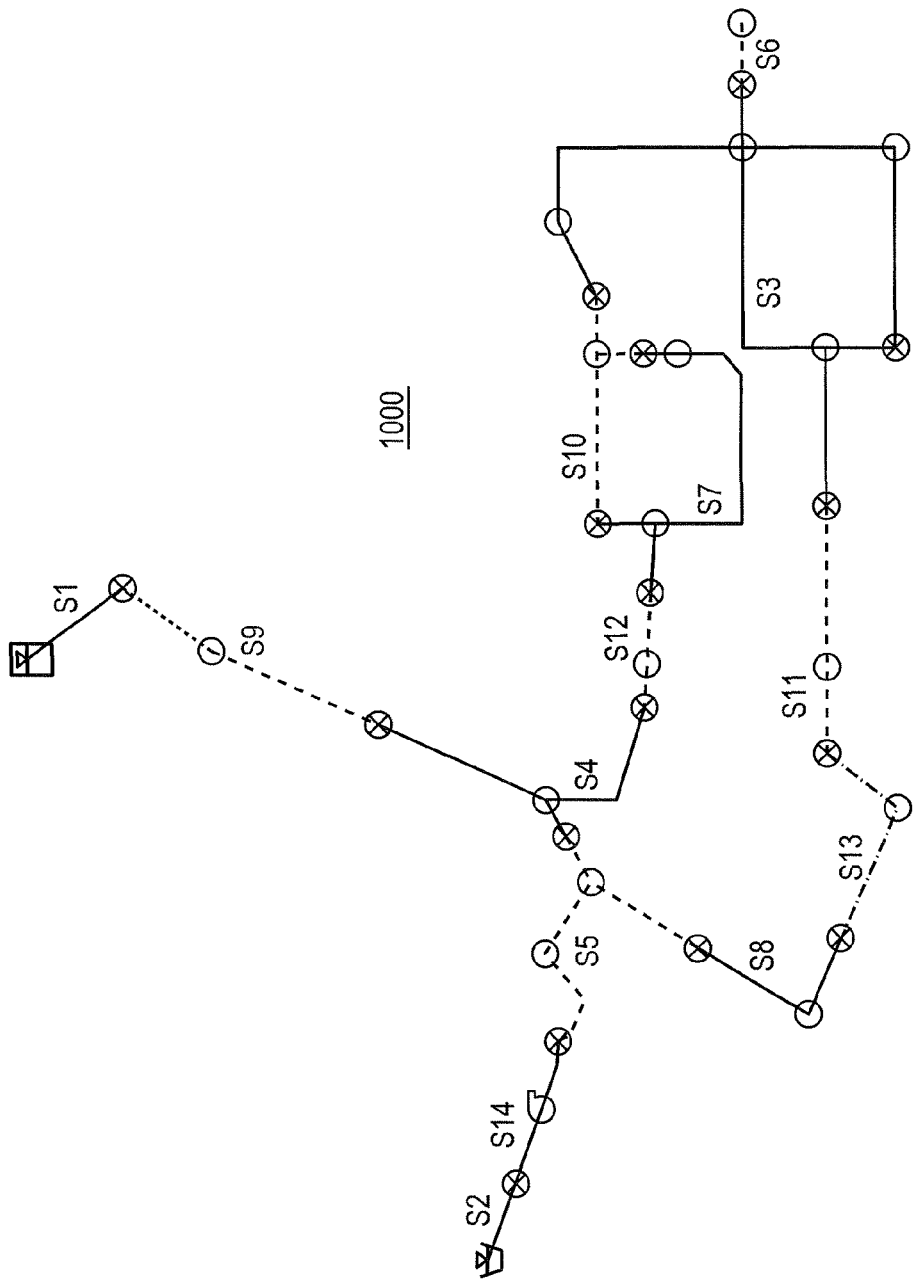
FIG. 10 is a schematic layer of the system of FIG. 9 showing the segmentation for the criticality analysis.
Figure 13:
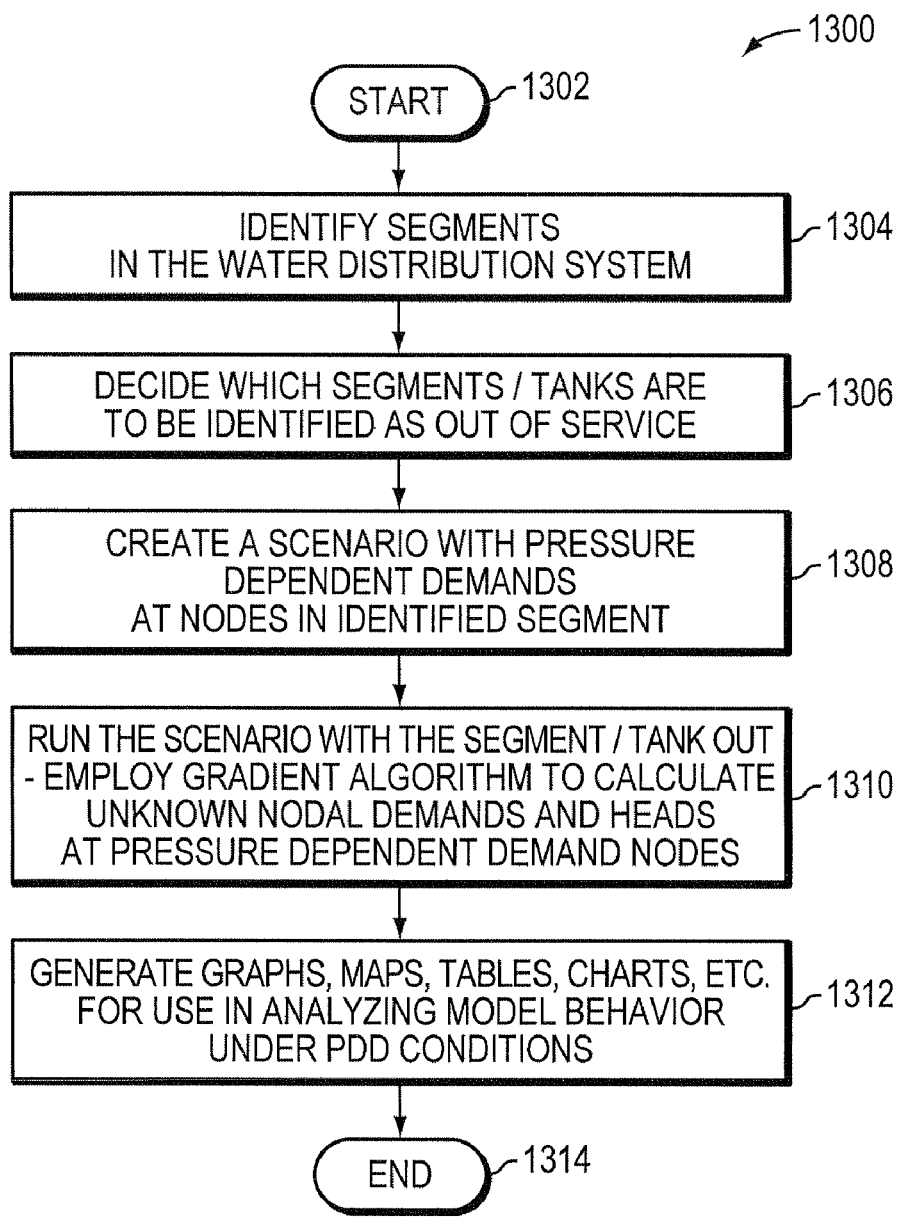
FIG. 13 is a flow chart of a procedure embodying the criticality analysis using pressure dependent demands in accordance with one embodiment of the present invention.

Criticality analysis is undertaken in two steps. The first step is to perform a system segmentation that divides the system into a number of segments based on a location of isolating valves. The isolating valves are illustrated in FIG. 9 as the valves V-1 through V16. Then, as shown in FIG. 10, the system 900 is divided into the segments s1 through s14 for a segmented system. A hydraulic simulation is conducted for one segment by assuming that all the elements (pipes and nodes) in the segment are out of service. The outage impact is evaluated by system supply shortfall as given in Table 1100 (FIG. 11) and 1200 (FIG. 12).

The criticality analysis results, as shown in Table 1100, indicate that most of the segment outages cause system supply shortfall by the conventional demand-driven analysis, the maximum demand shortfall may go up about 70%. When a segment is out of service, the flow path will change accordingly, which may result in a large head loss so that negative nodal pressures may occur by conventional demand-driven analysis. For instance, as shown in FIG. 10, when either segment s4 or s5 is out of service, the system demand will be supplied by only one flow path via s12 or s8. Since the demand-driven analysis assumes that the nodal demand is known and independent from the pressure so that 100% of demand for the rest of system will be forced through the remaining connected pipelines, an incorrectly large head loss results along the pipelines and negative pressures occurring at the downstream nodes, where the demand is deemed not met. Therefore, a larger than expected demand shortfall is reported for s4, s5 and s12 as shown in Table 1100.

Using pressure dependent demand simulation, on the other hand, the impact of each segment is analyzed by assuming different reference pressure of 14.06 meters (20 psi) and 70.31 meters (100 psi). The results obtained are given in Table 1100 for steady state simulation and in Table 1200 for extended period simulation (EPS). Instead of forcing all the required demand through the connected flow path, the nodal demand is calculated by the available pressure accordingly by the PDD function definition of the present invention. Using the technique of the present invention, the available partial demand is more accurately calculated for the nodes, the system shortfall is estimated less than the demand-driven approach.

It is shown that the greater the reference pressure, i.e. 70.31 meters (100 psi), the less demand is supplied at the same pressure level, the greater demand shortfall is resulted in as indicated in Table 1100. The criticality results for EPS simulation, as shown is in Table 1200, show the impact of each segment out of service for 24 hours. More segments are identified to cause the system shortfall with greater supply shortfall. The critical segments are s-2 (shortfall of −90.0), s-5 (shortfall of −90.0) and s-14 (shortfall of 90.0), which are the segments that connect to the reservoir via the pump. In addition, s12 that represents the weakest distribution segment that causes the greatest pressure drop when the outage occurs.

This case study seems to indicate that the reference pressure is an important parameter for applying pressure dependent demand in general, and evaluating the criticality using pressure in particular. The reference pressure is typically the pressure at which the demands at normal conditions are supplied. As will be understood by those skilled in the art, engineers can establish the reference pressures by calibrating the model under normal operating conditions (without pipe outage), then the calibrated model and the corresponding pressures can be used as reference pressure. These amounts differ from one type customer to another (such as residential, commercial and industry).

The criticality analysis with the pressure dependent demand techniques of the present invention may be further understood with reference to the flowchart 1300 of FIG. 1300. The procedure begins at step 1302 and continues to step 1304 in which the individual segments of the water distribution system are identified (as discussed with reference to FIGS. 9 and 10). In step 1306, the user can then select the segments, or storage tanks which are to be simulated as being out of service. In step 1308, a scenario is created which has assigned pressure dependent demands at nodes in identified segments. The scenario is then run with the selected segment as out of service as in step 1310. Running the scenario includes employing the gradient algorithm of the present invention that is includes the diagonal matrix D22 which is ultimately used in calculating the nodal demands for the pressure dependent demand nodes affected by the outage. This algorithm is described in detail herein above. In step 1312, the hydraulic modeling system 220 then generates graphs, maps, tables, charts and the like, as desired by the user for analyzing model behavior with the segment outage using PDD analysis. The procedure ends at step 1314.

Example of Large Model Performance

Figure 14:
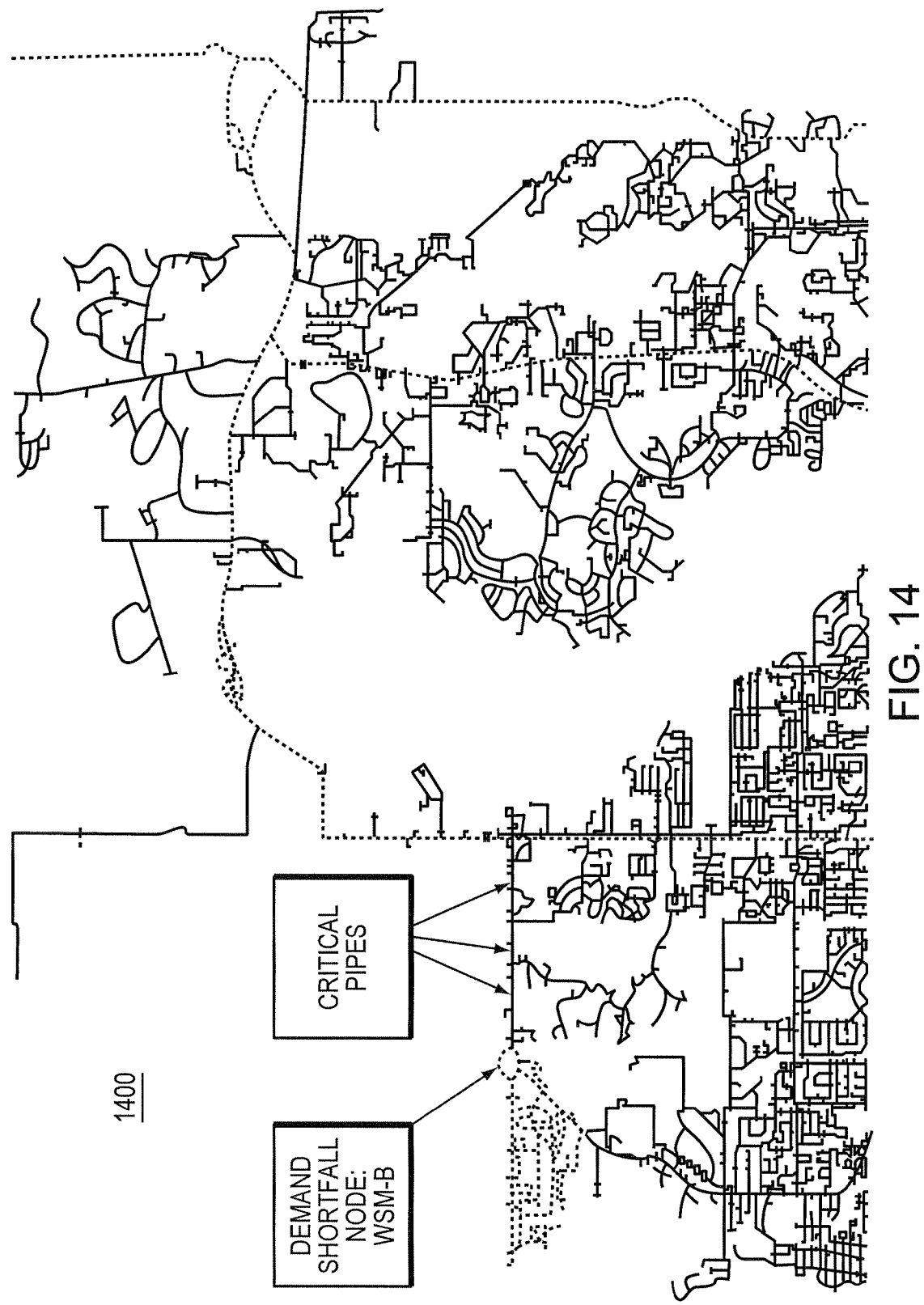
FIG. 14 is a schematic illustration of a water distribution system illustrating critical pipeline and demand shortfall nodes caused by critical pipe outage.

The example, shown in FIG. 14 relates to the water system of Pinellas County in Florida. The water system supplies drinking water to approximately 800,000 customers along Florida's central west coast and is sourced from Tampa Bay Water (TBW), the region's wholesale provider. Hydraulically, the system functions as two large transmission and distribution systems, i.e., the Northern system and the Central/Southern system that are networked together with a variable interface location, depending on demand conditions. The water source for the Northern system is from the Eldridge Wilde Wellfield. The water source for the Central/Southern system is from a 66-inch pipeline that connects directly to the TBW system which contains blended water including desalted water, surface water, and groundwater.

The system is composed of an extensive piping network, six pumping stations, and 11 storage tanks. The piping network includes approximately 3218 km (2,000 miles) of piping, with diameters ranging from less than 25.4 mm (1-inch) to 1676.4 mm (66-inch) and with several pipe materials including ductile iron, gray cast iron, pre-stressed concrete cylinder, steel, and polyvinyl chloride. The six pumping stations include 25 constant-speed and variable-speed pumps.

A model of the water system consists of 80,870 pipe, 25 pumps, and 11 storage tanks. The model was been constructed for Pinellas County by Jones, Edmunds & Associates, Inc. in support of a blending and pumping facility with a design maximum daily demand capacity of approximately 378 million liters (100 million gallons) per day. The new facility will blend the source waters and distribute a consistent water quality to the County's customers.

To test the application of applying pressure dependent demand to criticality analysis based upon segmentation, more than 69,921 artificial isolation valves were automatically inserted onto to the pipelines. This allowed a network tracing algorithm to automatically generate 65,562 segments for the whole system. The criticality analysis was performed for each of the segments, that is 65,562 consecutive hydraulic runs were automatically conducted for each of the conventional demand-driven and head-driven simulations. Each complete criticality analysis took about 2 hours, 58 minutes and 20 seconds, and 5 hours 33 minutes and 20 seconds respectively on a Pentium 4 machine with CPU 3.06 GHz and 1.0 GB of RAM. In average, each steady state hydraulic run takes about 0.2 seconds and 0.3 seconds for one demand-driven and head-driven simulation respectively. It exemplifies the efficiency of the hydraulic simulation of both conventional demand-driven and pressure dependent demand analysis for this scale of the model.

The criticality analysis results obtained were based on the hypothetic isolation valve locations. Once the real valve data is ready, a suitable model building tool, such as WATER-CAD® sold commercially by Bentley Systems, automatically inserts the isolation valves into the model for more accurate analysis. This exercise demonstrates the robustness and efficiency of the integrated network segmentation, criticality analysis and pressure dependent demand modeling.

Figure 15:
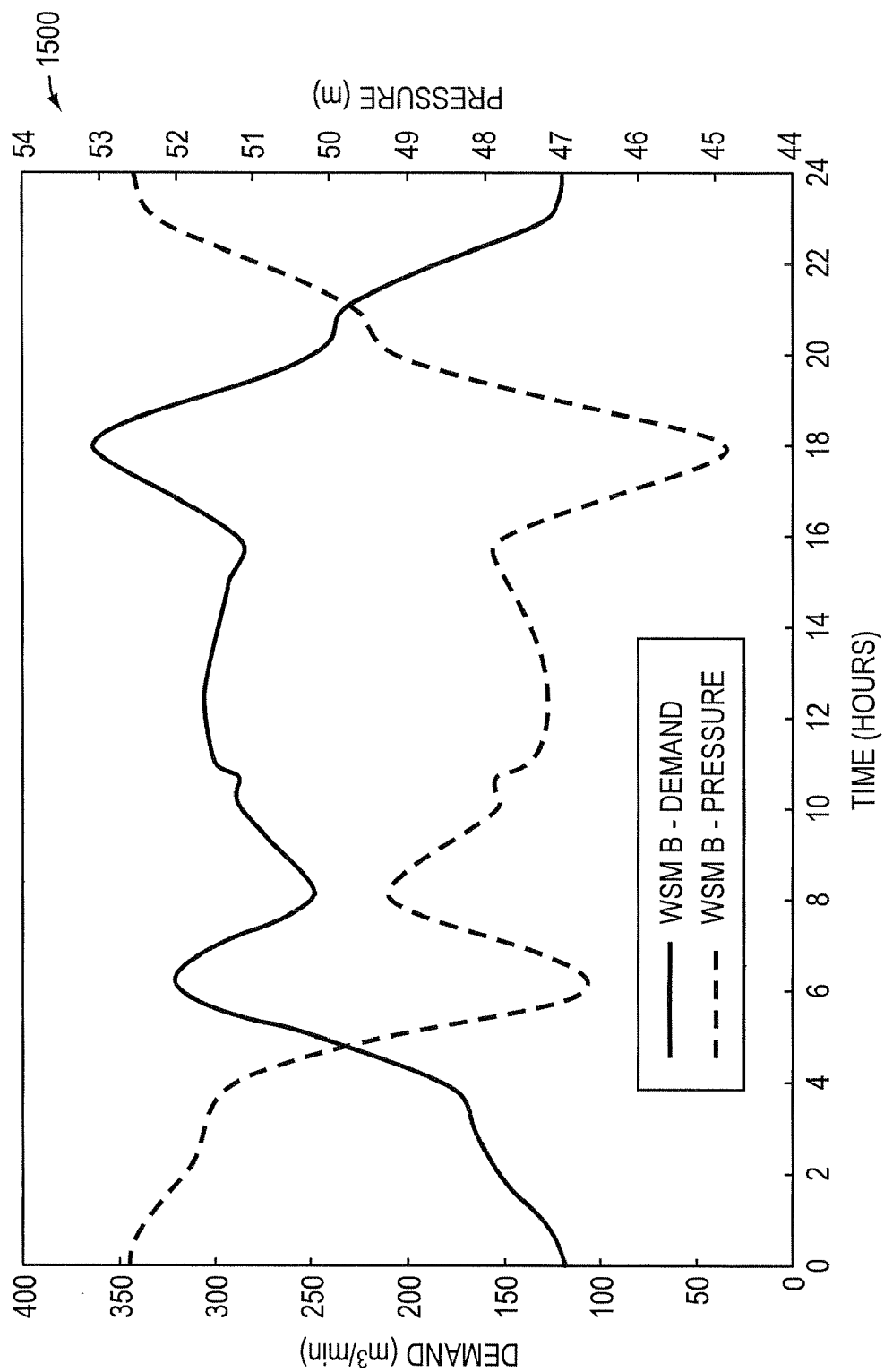
FIG. 15 is a graph of time in hours versus demand in cubic meters per minute, illustrating a demand and pressure for a particular node under normal operating conditions.
Figure 16:
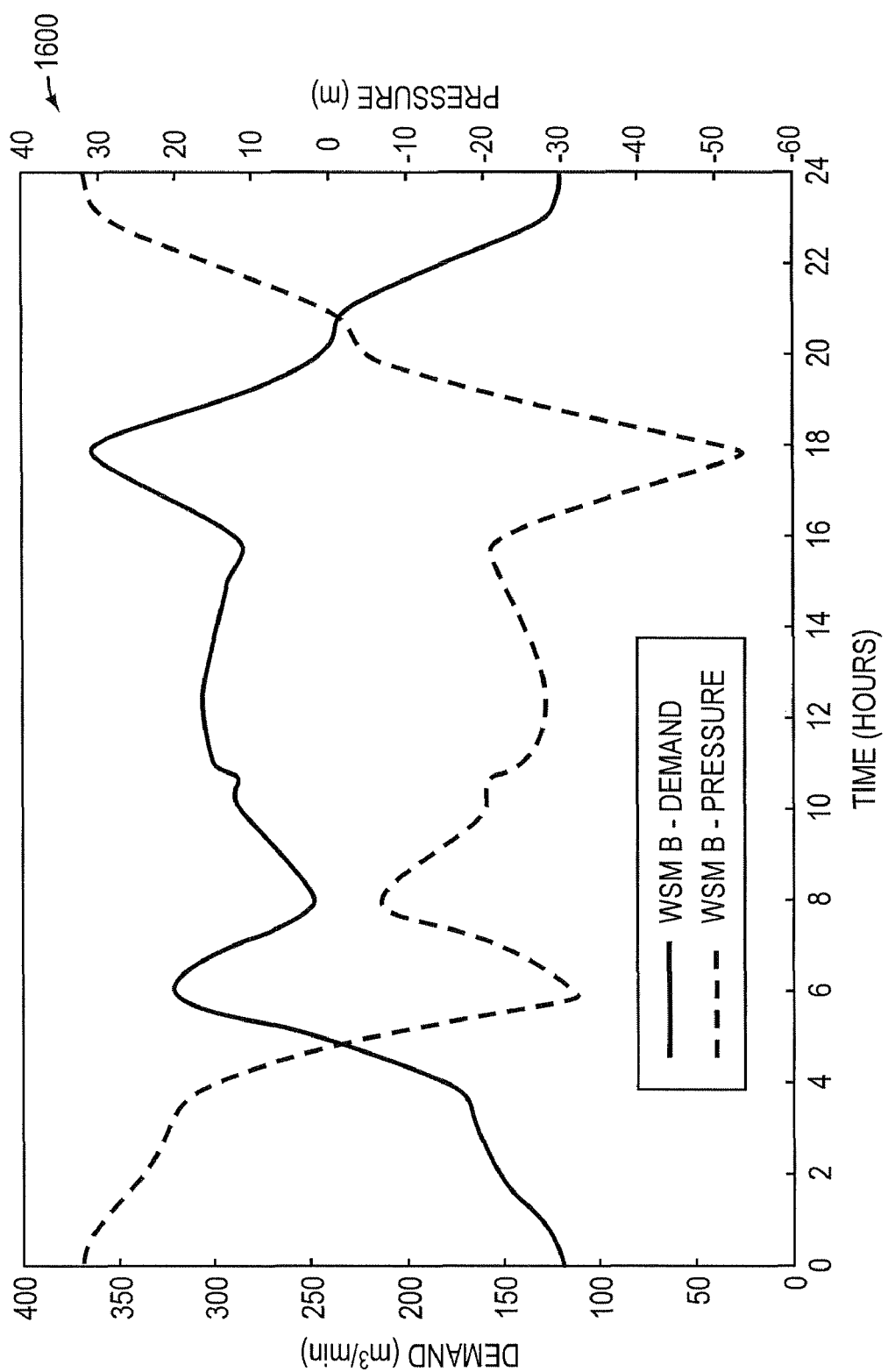
FIG. 16 is a graph of time in hours versus demand in cubic meters per minute illustrating a demand and pressure for a particular node using demand driven analysis when there is a critical pipe outage.

Pressure dependent demand analysis is able to more accurately quantify the impact of pipe outage. For instance, FIG. 14 shows the northern part of Pinellas water system, a pipeline is identified critical to the node WSMB and also the nodes in the west of WSMB. The results can be better understood with reference to the graph of FIG. 15, which is a plot of demand in m³/min again time in hours with the solid curve representing demand. The graph also illustrates pressure in meters as a function of time in hours, with the dashed curve representing pressure. Under normal conditions, the nodal demand is met at the pressure of 42.12 meters (60 psi), as shown in FIG. 15. Notably, if any of the pipes along the critical segment is out of service, this will cause a dramatic pressure drop. Using conventional demand-driven analysis, the calculated demand is met, but the calculated pressure at WSMB goes more than −49.21 meters (−70 psi) as shown in FIG. 16. It is just not possible to supply the full demand under the negative pressure. The available demand needs to be predicted for such an outage event.

Figure 17:
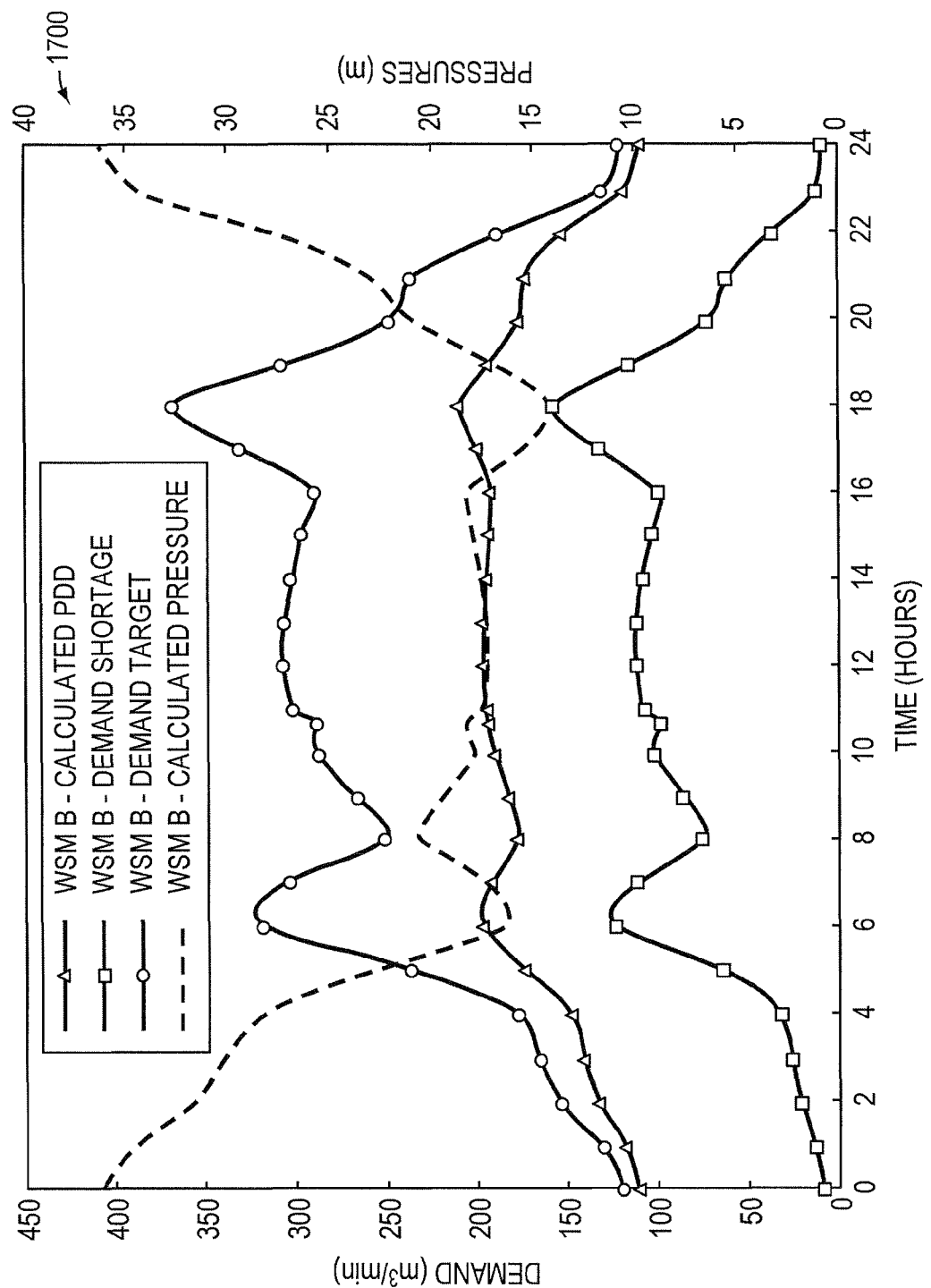
FIG. 17 is a graph of time in hours versus demand in cubic meters per minute illustrating calculated demand, pressure and demand shortfall over 24 hours at a particular node using pressure dependent demand analysis when there is a critical pipe outage.

To predict how much water can be supplied under such a pressure deficient condition, pressure dependent demand analysis in accordance with the invention is applied with a reference pressure specified as the normal operating pressure of 42.21 meters (60 psi), and the pressure threshold is set to be equal to the reference pressure, a power PDD function, given as Eq. (1) with exponent of 0.5, is used for PDD simulation run. The results are illustrated in FIG. 17, which is a graph of demand in m³/min as a function of time (hours) and a plot of pressure (m) against time (hr). The available demand is reduced accordingly as pressure drops. This exemplifies that PDD analysis is able to rationally evaluate the impact of pipe outage while conventional demand-driven analysis may lead to confusing results.

In accordance with the software program of the present invention, one or more computer readable instructions generate a graphic user interface as shown in FIGS. 18A-18D. The screen of FIG. 18A has a toolbar such as toolbar 1802, that can be used to set up the pressure dependent demand analysis. More specifically, the first step is to set up the model, then a PDD function is created. The user chooses Components>Pressure Dependent Demand Functions, and selects an operation from the toolbar 1802. The meaning of each item in the toolbar 1802 is set forth in the table of FIG. 18B. Other items and icons may be added to the toolbar while remaining within the scope of the present invention. For example, the user may select "New" to create a new pressure dependent demand function. Then, the Properties pane (FIG. 18C) allows the user to select the "Function Type" menu 1804, using which the user can select and selects "Power Function." The power function exponent a is set in block 1806. Pressure threshold can be checked in box 1808, and the amount can be set in window 1810. Notably, pressure threshold is the maximum pressure at which the demand is kept constant. The power function graph window 1850 shows the curve 1850 of FIG. 18C.

Figure 18C:
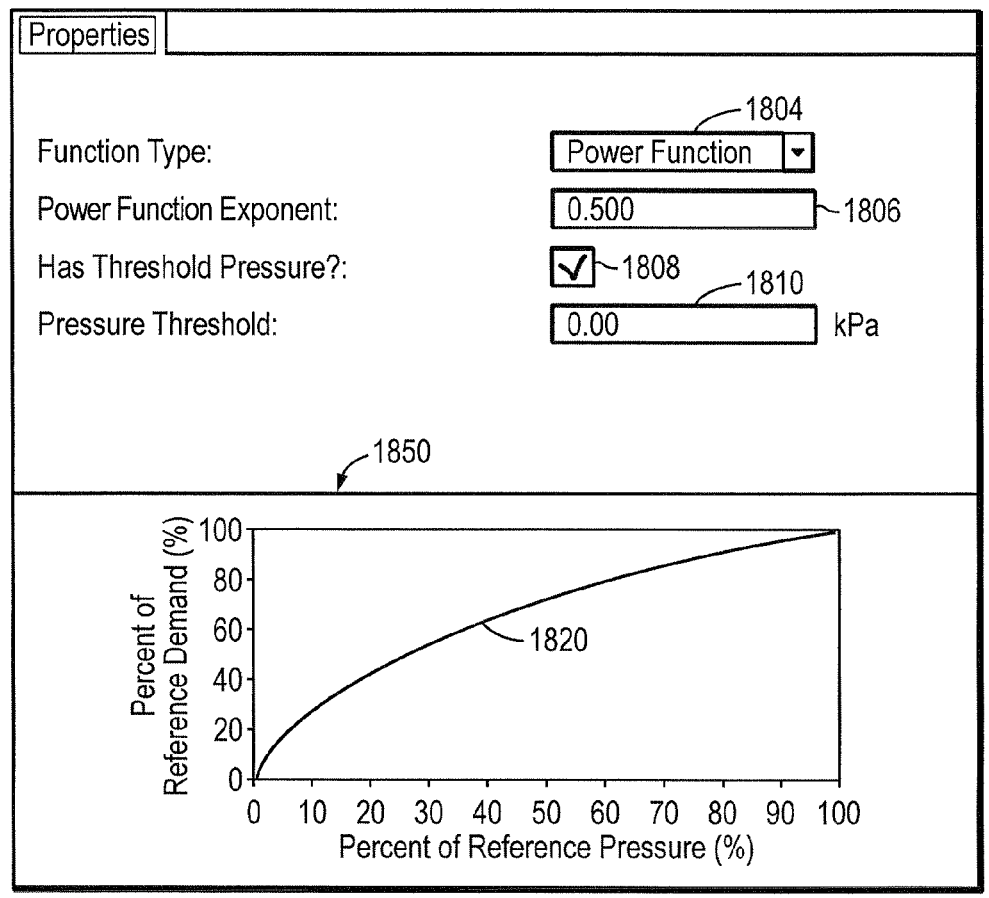
FIGS. 18A through 25E are screen shots of illustrative graphic user interfaces in accordance with an illustrative embodiment of the invention that a user may employ when using the software embodying the invention.
Figures 18D, 18E:
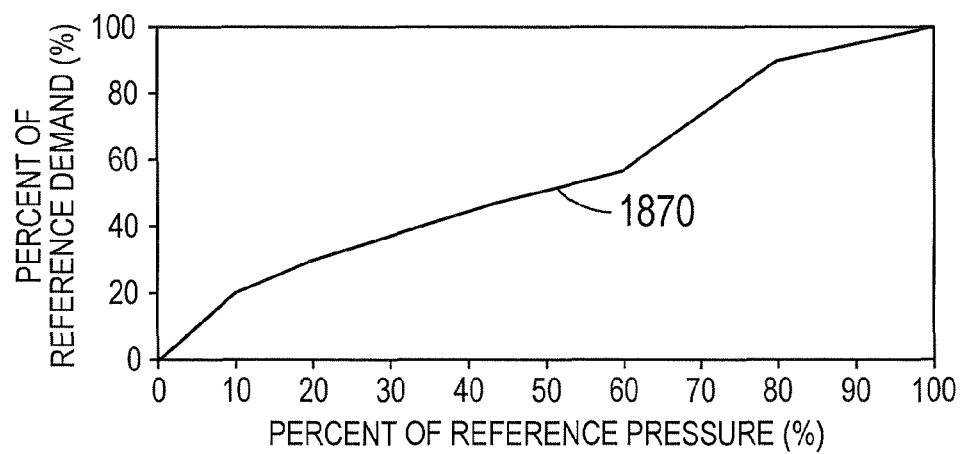

In another application of the invention, the Function Type can be selected as a "Piecewise Linear" function (1860) as shown in FIG. 18D. The Piecewise Linear Function selection provides a table of reference pressure percentage vs. reference demand percentage. The last entry value of the reference pressure table is the greatest value, and it is defined the threshold pressure. Further, if the last pressure percentage is less than 100%, then the threshold pressure is equal to the reference pressure. If the last pressure percentage is greater than 100%, then the threshold pressure is the product of the reference pressure multiplied by the greatest pressure percentage.

FIG. 18E illustrates the curve 1870 which is a plot of Percent of Reference Pressure (%) versus Percent of Reference Demand (%). Notably, the Percent of Reference Pressure (%) defines the percentage of a nodal pressure to reference pressure and Percent of Reference Demand defines the percentage of nodal demand to a reference demand.

Figure 19:
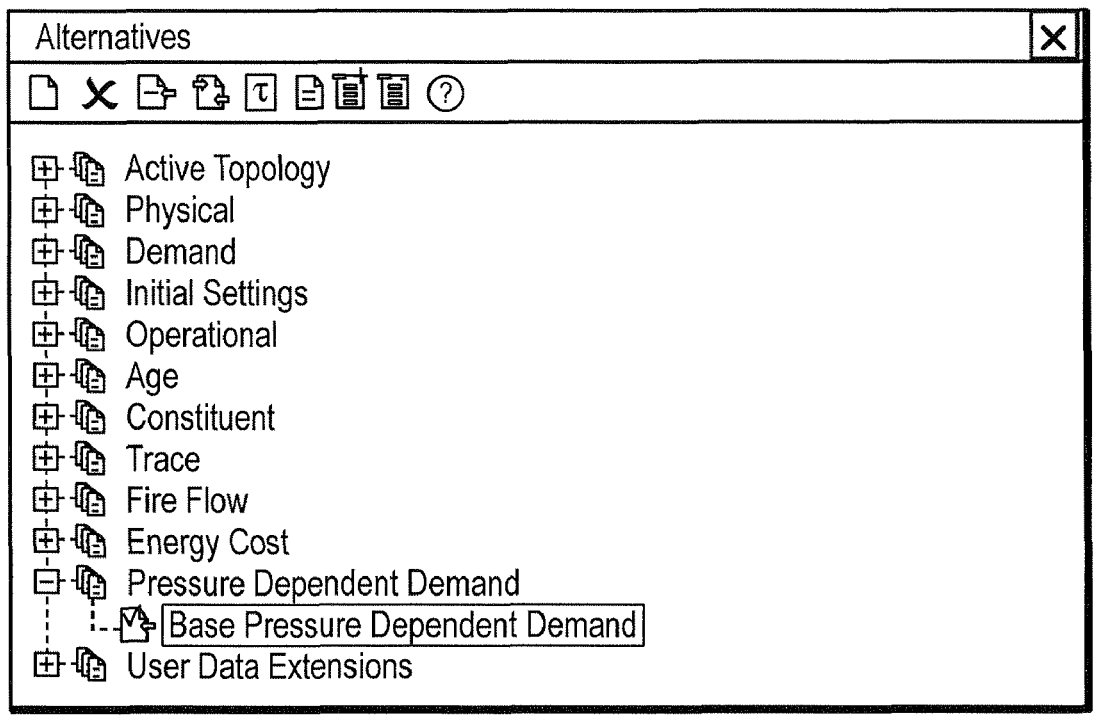
Figure 20:
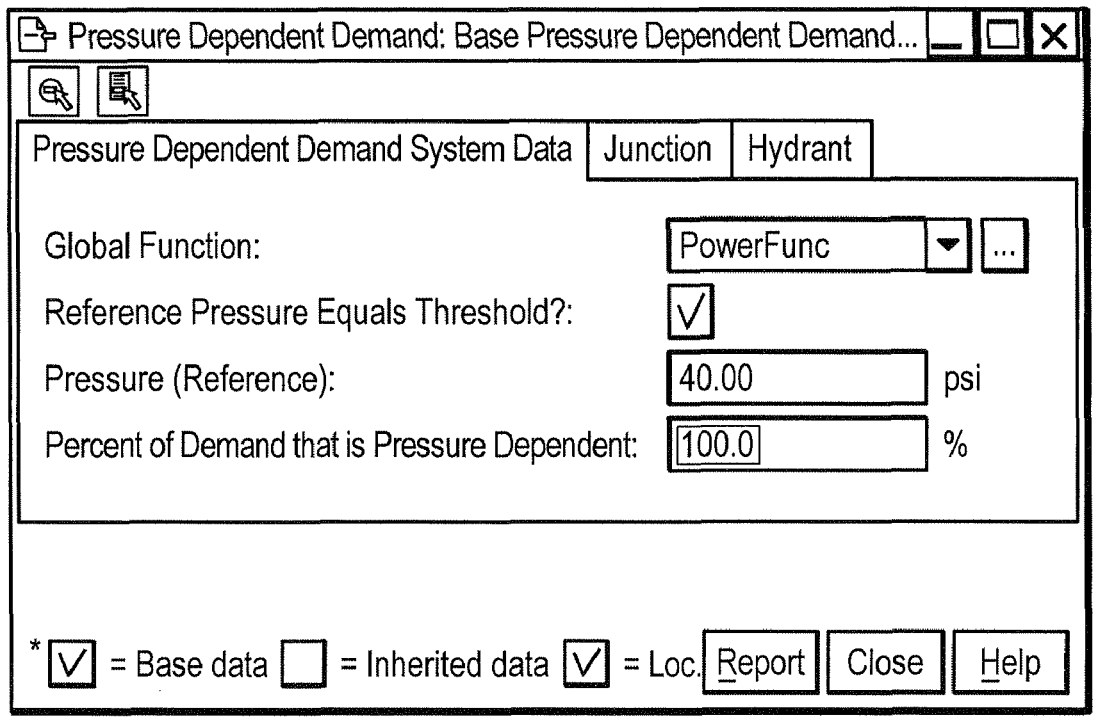

Next, as shown in FIG. 19, the user chooses Alternatives and selects Pressure Dependent Demand Alternative, and then chooses Base Pressure Dependent Demand. This generates the screen of FIG. 20, using which the user selects PowerFunc from the Global Function menu. The user can set the Reference Pressure to be equal to the threshold, and sets the amount to be 40.00 psi. The percent of demand that is pressure dependent is set at 100%.

Figure 21B:
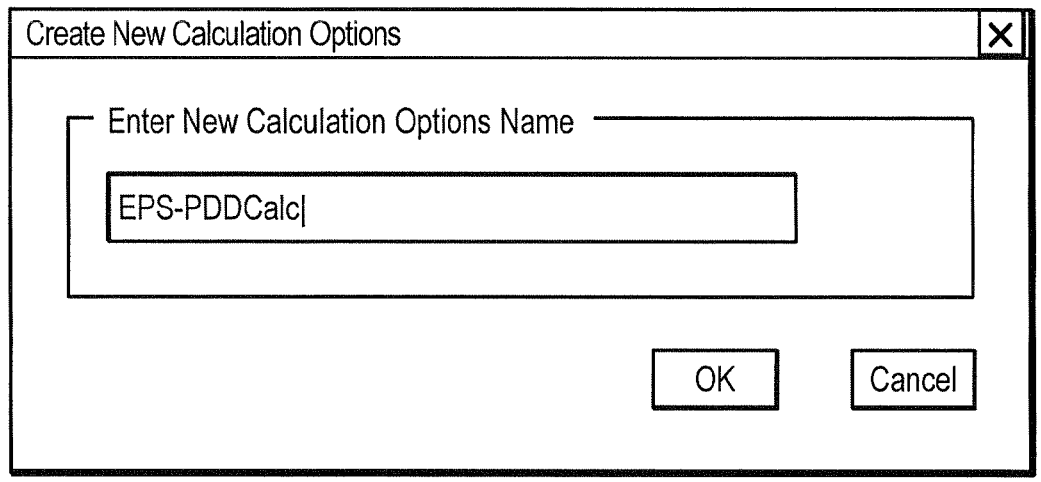
Figure 21A:
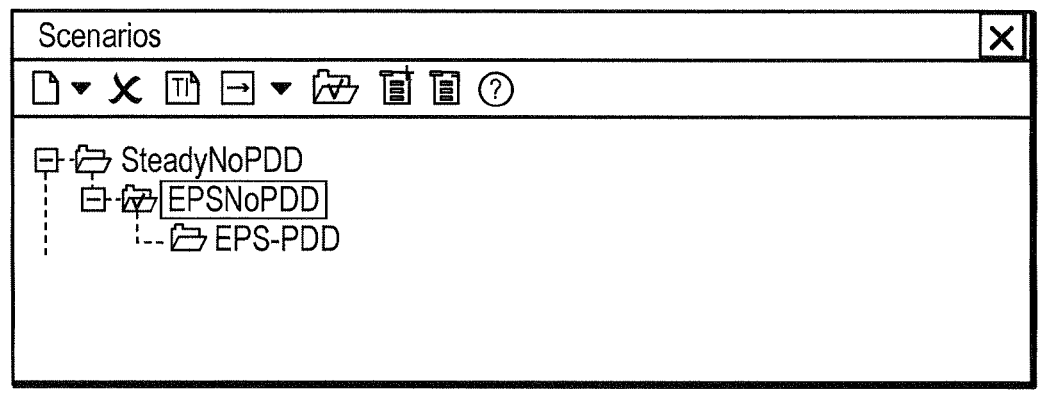
Figure 22:
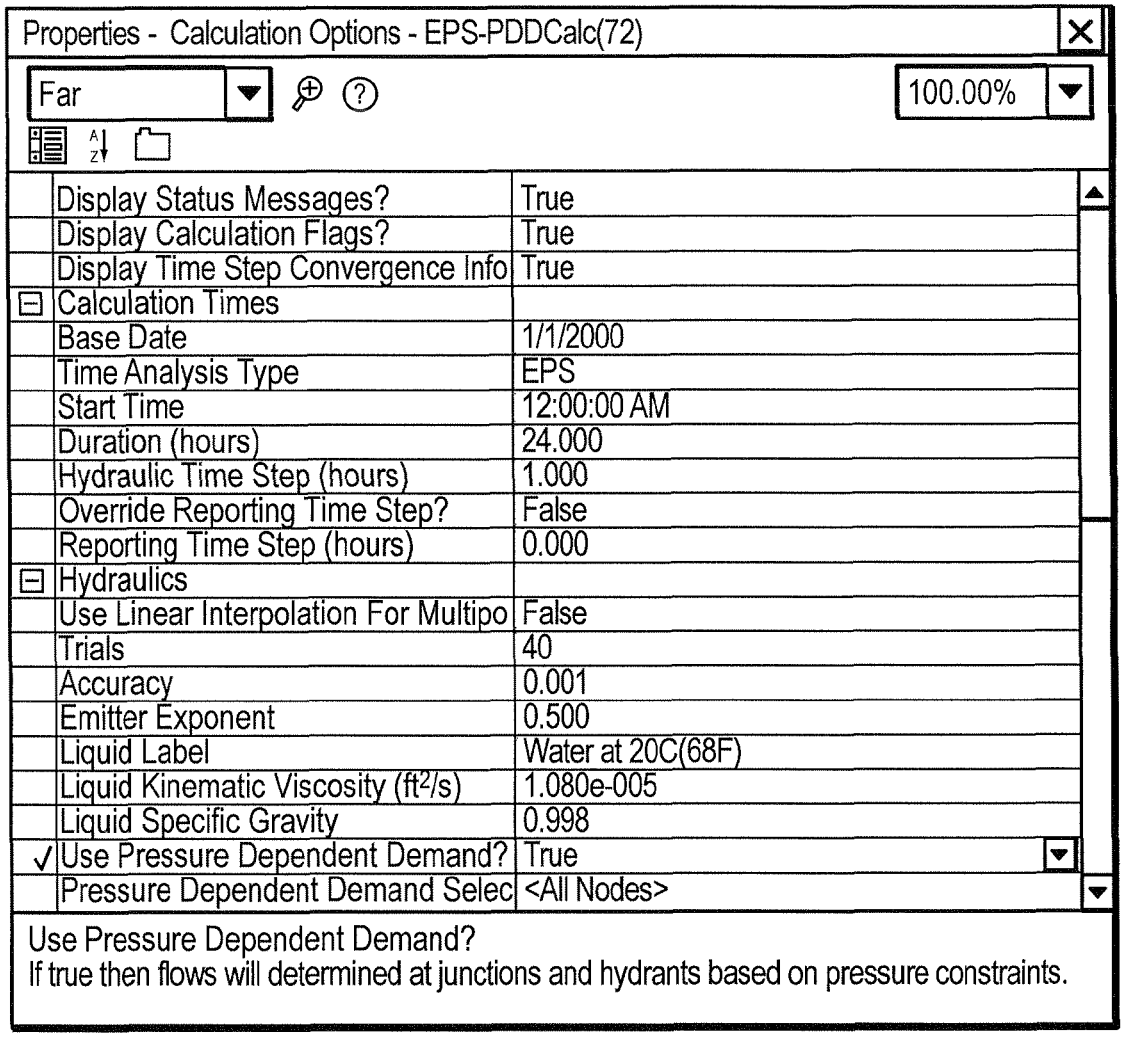
Figure 23:
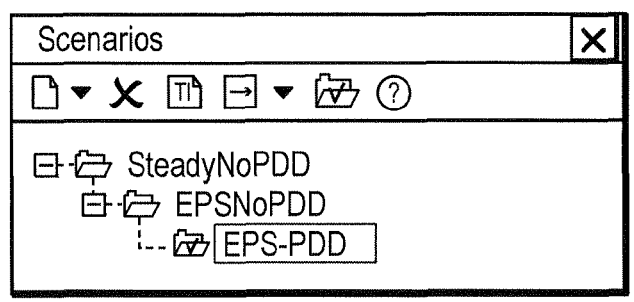
Figure 24:
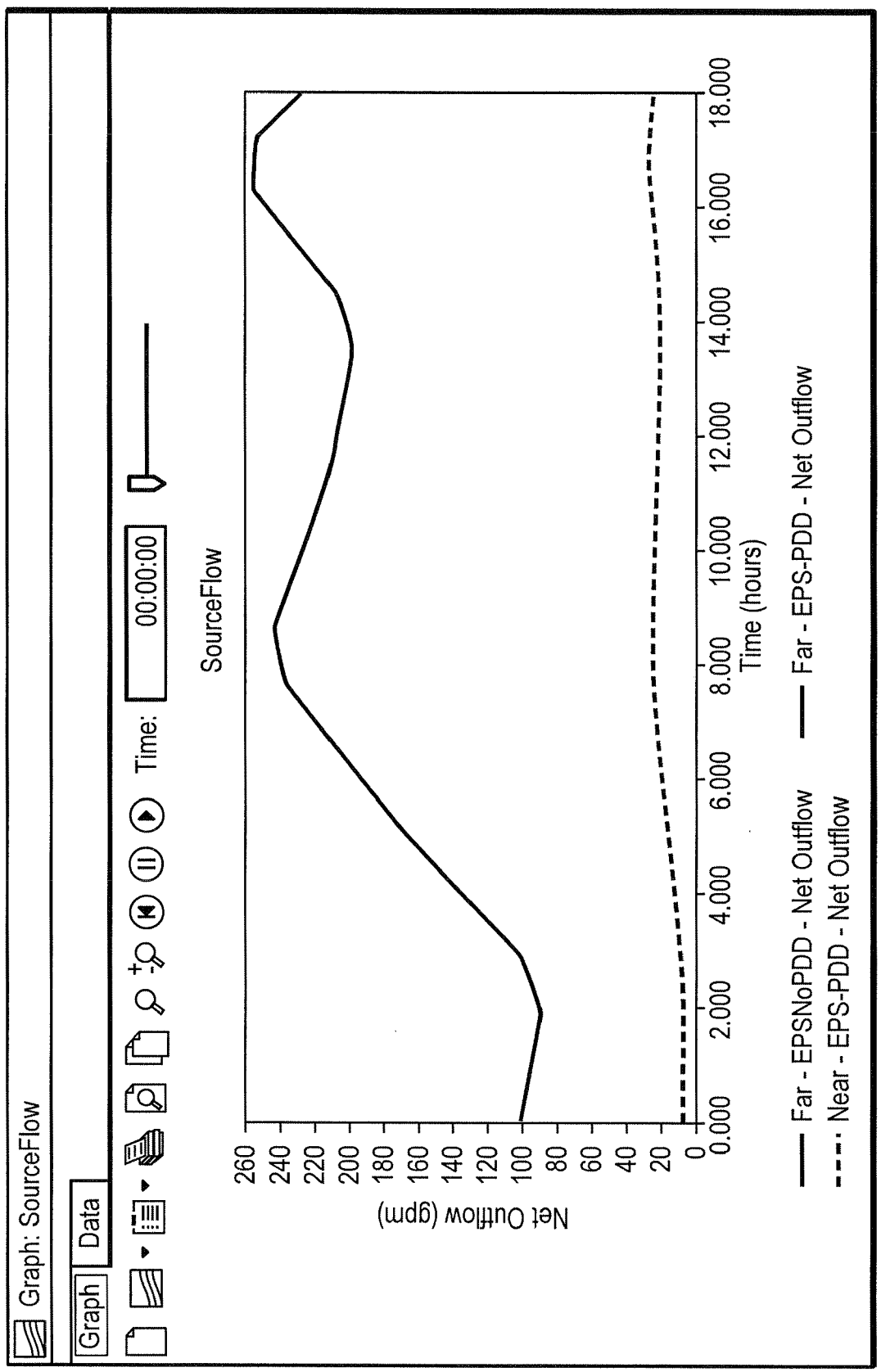

In FIGS. 21A and 21B, for example, the user selects EPS-PDD for extended period simulation-pressure dependent demand. Using the menu in FIG. 22, the user can select calculation options for the run, as described with reference to FIG. 8. Then, all windows are closed and the computation is performed (FIG. 23). The user may elect to review the results by plotting a graph of flow v. time and such a graph is illustrated in FIG. 24.

Figure 25A:
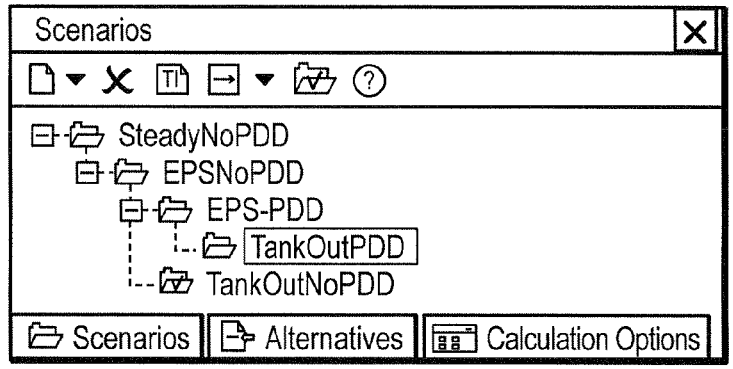
Figure 25B:
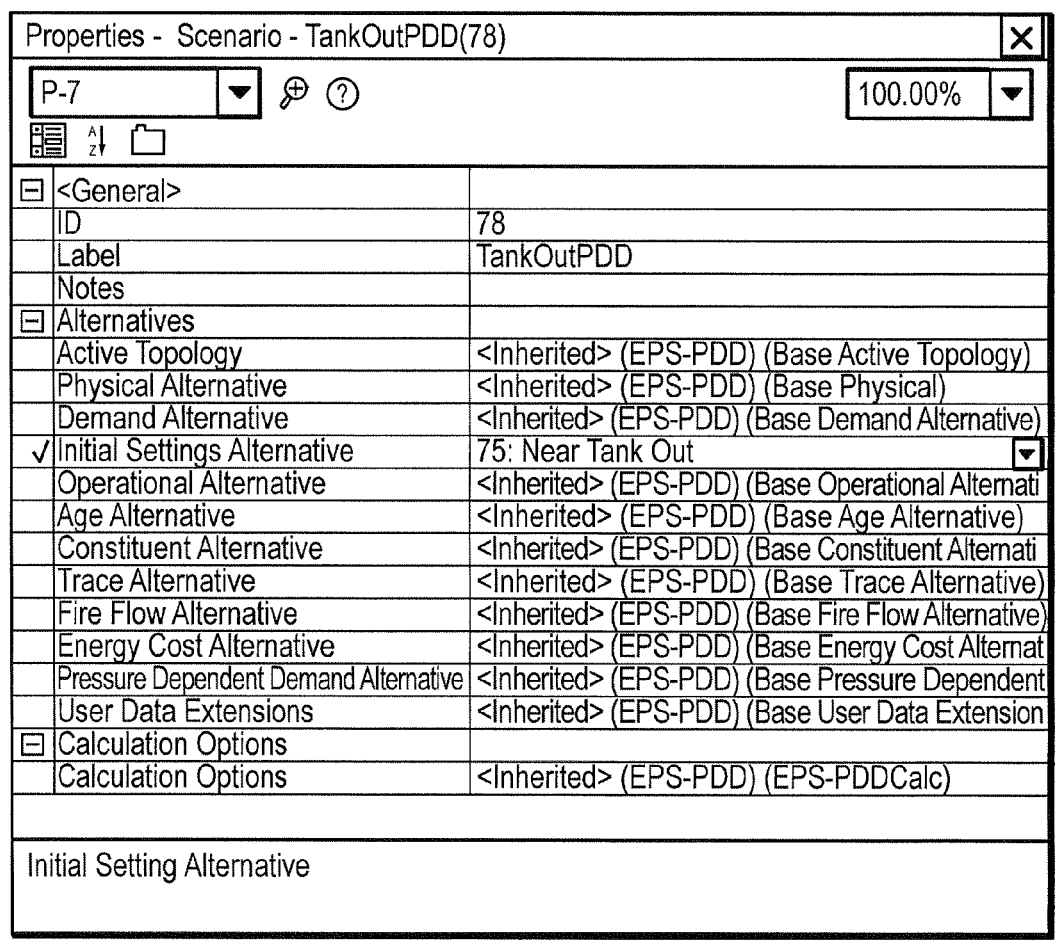
Figure 25C:
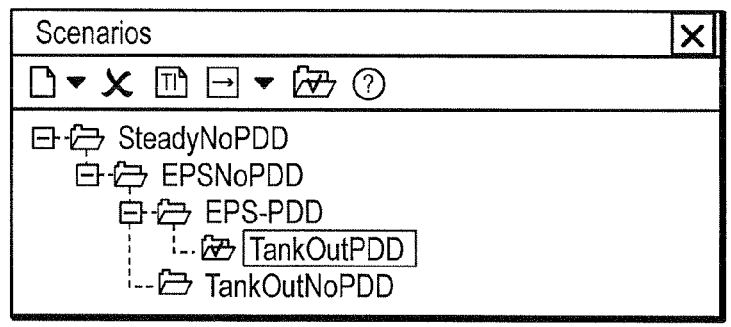
Figure 25D:
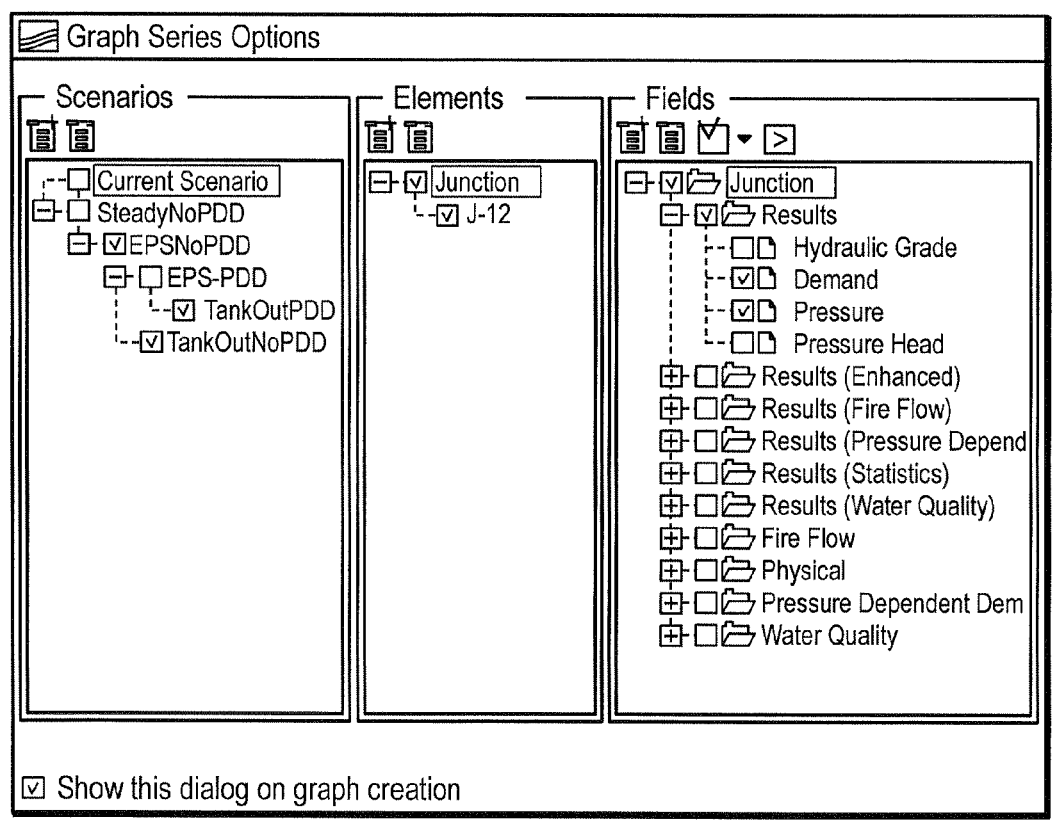
Figure 25E:
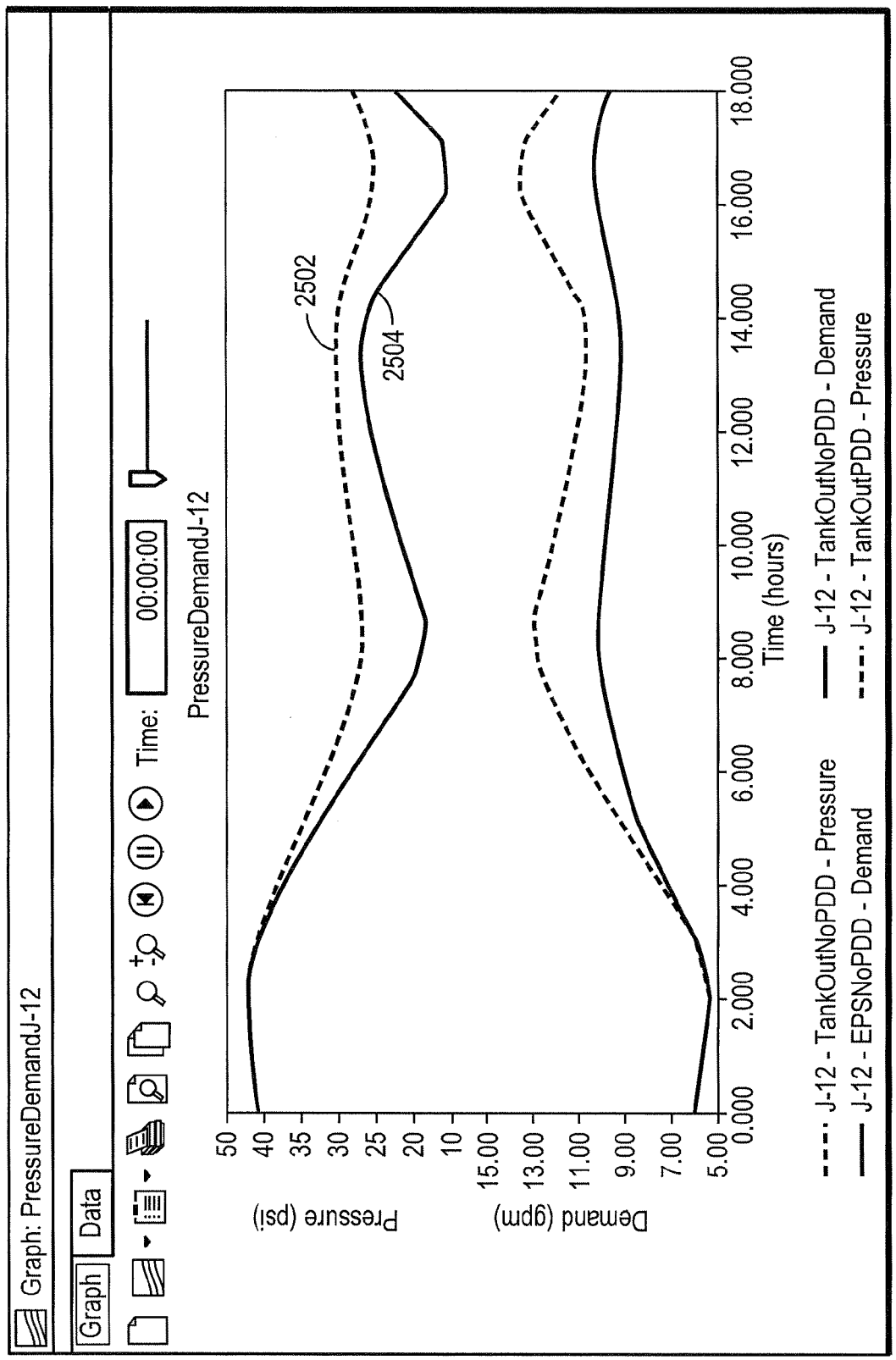

FIGS. 25A through 25E illustrate a series of screens that are provided in accordance with the present invention for running a pressure dependent demand model and simulating the effects of a storage tank outage. ("TankOutPDD"). In FIG. 25A, a TankOutPDD scenario is selected. In FIG. 25B, the particular tank is selected. In the screen of FIG. 25C, the TankOutPDD scenario is computed. In FIG. 25D, the elements to be graphed showing the results are selected. The graph is thus created and is illustrated in FIG. 25E. The curve 2502 illustrates the pressure for the Junction J-12 for a TankOUtPDD run. This can be compared to the graph 2504 which was for the case where pressure dependencies were not taken into account, and the differences are apparent.

It should be understood that the present invention provides an improved technique for calculating and displaying results of calculations for pressure dependent demands in a water distribution system. The approach for pressure dependent demand analysis of the present invention provides a robust and efficient method for analyzing many conditions where the demand is a function of pressure in a water distribution system. The technique of the present invention is flexible at modeling the mixed volume-based and pressure dependent demands and improves the modeling capability of the conventional distribution system analysis. The proposed head-driven solution method is more accurate than the demand-driven analysis method for evaluation of system impact of element outages. The approach can be applied to analyzing many pressure dependent demand scenarios including element outages, system maintenance, leakage, insufficient to water sources, intermittent supply, sprinkler flows, criticality and reliability analysis.

It should be understood that the foregoing description has been directed to specific embodiments of the invention. It will be apparent, however, that other variations and modifications may be made to the describe embodiments, with the attainment of some or all of the advantages of such. Therefore, it is the object of the impending claims to cover all such variations and modifications as come become within the true spirit and scope of the invention.

What is claimed is:

1. A computer implemented method for pressure dependent demand analysis in a model of a water distribution system, comprising:
   obtaining a model of a water distribution system including pipes and nodes;
   creating a pressure dependent demand function in which nodal demand changes as nodal pressure changes for use with said model of said water distribution system;
   creating a scenario to be modeled including assigning said pressure dependent demand function to one or more nodes of said model of said water distribution system;
   passing scenario information to an associated hydraulic network solver engine and calculating unknown nodal demands for the assigned pressure dependent demand nodes by using a gradient algorithm that includes a diagonal matrix for pressure dependent demand nodes whose elements each indicate an actual supplied demand at a pressure dependent demand node as a function that includes a ratio of actual pressure over reference pressure at said pressure dependent demand node; and
   passing results computed by said hydraulic network solver engine to hydraulic modeling software and displaying results on a display, for analysis by a user.

2. The computer implemented method as defined in claim 1 wherein said scenario to be modeled includes a case where pressure drops to less than or equal to zero.

3. The computer implemented method as defined in claim 1 wherein said pressure dependent demand function specifies a function relationship between pressure and demand over a range of interest.

4. The computer implemented method as defined in claim 1 wherein said pressure dependent demand function is a power function and a power function exponent can be selected by the user.

5. The computer implemented method as defined in claim 1 wherein said pressure dependent demand function is a piecewise linear function.

6. The computer implemented method as defined in claim 1 wherein said scenario to be modeled includes cases in which pressures exceed the reference pressure at which demands are fully met.

7. The computer implemented method as defined in claim 1 wherein the pressure dependent demand function is applied to analyzing leakage where demand does not level off at a pressure.

8. The computer implemented method as defined in claim 1 wherein said gradient algorithm comprises a matrix equation:

$$\begin{bmatrix} A_{11} & \ldots & A_{12} \\ \ldots & \ldots & \ldots \\ A_{21} & \ldots & A_{22} \end{bmatrix} \begin{bmatrix} Q \\ H \end{bmatrix} = \begin{bmatrix} -A_{10}H_0 \\ \ldots \\ -q^* \end{bmatrix}$$

where Q is a $[n_p, 1]$ vector of unknown pipe discharges, H is a $[n_n, 1]$ vector of unknown nodal heads, $q^*$ is a $[1, n_n]$ vector of actual demands for pressure deficient nodes, $H_0$ is a $[n_t-n_n, 1]$ vector of known nodal heads, $A_{11}$ is a $[n_p, n_p]$ diagonal matrix for pipes and pumps, $A_{11}$ is a $[n_p, n_p]$ diagonal matrix for pipes and pumps, $A_{22}$ is a $[n_n, n_n]$ diagonal matrix for pressure dependent nodes, $A_{12}$ and $A_{21}$ are $[n_p, n_t]$ matrices of topological incidences that define pipe and node connectivity, $A_{10}$ is a $[n_t-n_n, 1]$ vector of topological incidences for known-head nodes; $n_t$ is a total number of nodes, $n_n$ is a number of unknown-head nodes and $n_p$ is a total number of links.

9. The computer implemented method as defined in claim 8 wherein the pressure dependent demand function is:

$$\frac{Q_i^s}{Q_{ri}} = \begin{cases} 0 & H_i \leq 0 \\ \left(\frac{H_i}{H_{ri}}\right)^\alpha & H_i \leq H_t \\ \left(\frac{H_t}{H_{ri}}\right)^\alpha & H_i \geq H_t \end{cases}$$

where $H_i$ is a calculated pressure at node i, $Q_{ri}$ is a requested demand or reference demand at node i, $Q_i^s$ is a calculate demand at node i, $$\frac{Q_i^s}{Q_{ri}}$$

is a ratio of calculated demand over the reference demand at node i, $H_{ri}$ is a reference pressure that supplies full requested or reference demand, $H_t$ is a pressure above which demand is independent of nodal pressure and $\alpha$ is an exponent of a pressure demand relationship.

10. The computer implemented method as defined in claim 9 further comprising:
solving a derivation of the gradient algorithm:

$$\begin{bmatrix} D_{11} & \ldots & A_{12} \\ \ldots & \ldots & \ldots \\ A_{21} & \ldots & D_{22} \end{bmatrix} \begin{bmatrix} dQ \\ \ldots \\ dH \end{bmatrix} = \begin{bmatrix} dE \\ \ldots \\ dq \end{bmatrix}$$

where H is pressure head and $D_{22}$ is a deviation of $A_{22}$.

11. The computer implemented method as defined in claim 10 further comprising providing as said diagonal matrix, $D_{22}$:

$$D_{22}(i,i) = \begin{cases} 0 & H_i^s \leq 0 \\ \alpha \left(\dfrac{H_i}{H_{ri}}\right)^{\alpha-1} \times Q_i & H_i^s \leq H_t \\ 0 & H_i^s \geq H_t \end{cases}$$

12. The computer implemented method as defined in claim 11 further comprising:
calculating $D_{22}$ for each pressure dependent demand node and adding to A(i,i) as $$A(i,i) = \sum_j p_{ij} - D_{22}(i,i) \quad \forall\, i \cap j \neq \emptyset,\, i \in 1, n_n,\, j \in 1, n_t$$

$A(i,j) = -p_{ij} \forall i \cap j \neq \emptyset, i,j \in 1, n_n$ where j denotes a pipe j that is connected with node i, and $P_{ij}$ is an inverse derivative of headloss in a link between nodes i and j with respect to flow.

13. The computer implemented method as defined in claim 1 further comprising:
identifying segments of the water distribution system and including segments in a set of elements along with the pipes and nodes, said segments being a portion of the water distribution system that can be isolated by valving, one or more segments including nodes which are assigned pressure dependent demand functions;
simulating an outage of one or more segments that includes nodes which are assigned with pressure dependent demand functions; and
evaluating one or more pressure dependencies at nodes during said simulating the outage of one or more segments.

14. The computer implemented method as defined in claim 13 further comprising determining a shortfall in demand below a desired demand in a portion of the water distribution system that occurs upon an outage of one or more segments.

15. The computer implemented method as defined in claim 13 further comprising providing isolating valves as elements in the set of elements.

16. The computer implemented method as defined in claim 15 further comprising calculating a hydraulic impact of the outage of one or more segments.

17. The computer implemented method as defined in claim 16 further comprising calculating the hydraulic impact of the outage of one or more segments by determining an impact of pressure on flow supply by modeling pressure dependent demand in one or more selected segments.

18. A computer modeling system for analysis of pressure dependencies in a water distribution system, comprising:
a hydraulic modeling program and associated solver engine configured to construct a model of, and to run simulations of, a water distribution system made up of pipes and nodes;
a pressure dependent demand process that is in communication with said hydraulic modeling program and solver, and which is configured to perform a calculation using a derivation of a gradient algorithm, the derivation of the gradient algorithm to include a diagonal matrix that is a derivation of pressure head and to add the diagonal matrix that is a deviation pressure head to head results that are calculated for one or more nodes in the network; and
a workstation having a display, the workstation configured to produce a graphic representation of the water distribution system illustrating calculated pressure is dependencies on the display.

19. The computer modeling system as defined in claim 18 further comprising one or more graphic user interfaces provided on the display that allow a user to make segmentations of the network and to evaluate the impact of outages at nodes assigned to be pressure dependent nodes.

20. The computer modeling system as defined in claim 19 further comprising an animation process for animating elements of said model of said water distribution system under selected scenarios.

21. A non-transitory computer readable media storing computer software that when executed is operable to:
obtain a model of a water distribution system that includes a plurality of pipes and nodes;
use a pressure dependent demand function with said model of said water distribution system, said pressure dependent demand function defining nodal demands that change in response to nodal pressure changes;
create a scenario to be modeled where said pressure dependent demand function is assigned to one or more nodes of said model of said water distribution system;
calculate unknown nodal demands for said one or more nodes of said model of said water distribution system to which said pressure dependent demand function is assigned, said calculating to employ a gradient algorithm that includes a diagonal matrix for pressure dependent demand nodes whose elements each indicate an actual supplied demand at a pressure dependent demand node as a function that includes a ratio of actual is pressure over reference pressure at said pressure dependent demand node; and
using said calculated unknown nodal demands to generate results that are displayed in one or more graphs, charts, or tables shown on a display to a user.

* * * * *

UNITED STATES PATENT AND TRADEMARK OFFICE
CERTIFICATE OF CORRECTION

PATENT NO. : 8,175,859 B1
APPLICATION NO. : 11/777491
DATED : May 8, 2012
INVENTOR(S) : Zheng Yi Wu et al.

It is certified that error appears in the above-identified patent and that said Letters Patent is hereby corrected as shown below:

Col. 1, line 50 should read: "In such cases, the assumption is that the demands are constant"

Col. 2, line 49 should read: "like leakages are pressure dependent. In is such scenarios,"

Col. 3, line 15 should read: "change on the flow supplied. is There remains a need, there-"

Col. 5, line 46 should read: "reference demand. Unlike the conventional water is distribu-"

Col. 6, line 43 should read: "store information describing each particular element is (such"

Col. 8, line 35 should read: "efficient and effective analysis of a variety of pressure is"

Col. 10, line 17 should read: "dependent demand is to assigned as an alternative feature in"

Col. 10, line 24 should read: "invention, when the hydraulic solver engine 250 is computers"

Col. 10, line 59 should read: "nodes i and j with respect to flow. Then, in step 814, is these"

Col. 12, line 15-16 should read: "simulation, as shown is in Table 1200, show the impact of each"

Col. 12, line 49 should read: "that is includes the diagonal matrix D22 which is ultimately"

Col. 14, line 40 should read: "pressure table is the greatest value, and it is defined the thresh-"

Col. 15, line 28-29 should read: "element outages, system maintenance, leakage, insufficient to"

Col. 18, line 22-23 should read: "distribution system illustrating calculated pressure is depen-"

Col. 18, line 52 should read: "node as a function that includes a ratio of actual is"

Signed and Sealed this
Tenth Day of July, 2012

David J. Kappos
*Director of the United States Patent and Trademark Office*